United States Patent
Brickner et al.

(10) Patent No.: US 6,388,587 B1
(45) Date of Patent: May 14, 2002

(54) PARTIAL RESPONSE CHANNEL HAVING COMBINED MTR AND PARITY CONSTRAINTS

(75) Inventors: Barrett J. Brickner, Edina, MN (US); Pradeep R. Padukone, San Jose, CA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/476,629

(22) Filed: Dec. 31, 1999

Related U.S. Application Data

(60) Provisional application No. 60/141,622, filed on Jun. 30, 1999.

(51) Int. Cl.$^7$ ................................ H03M 7/00
(52) U.S. Cl. ........................ 341/59; 714/802
(58) Field of Search ............ 341/59, 58, 94, 341/91; 714/800, 802, 794, 792, 809, 805, 795, 796

(56) References Cited

U.S. PATENT DOCUMENTS

| | | | |
|---|---|---|---|
| 5,537,112 A | 7/1996 | Tsang | 341/59 |
| 5,576,707 A | 11/1996 | Zook | 341/58 |
| 5,731,768 A | 3/1998 | Tsang | 341/59 |
| 5,859,601 A | 1/1999 | Moon et al. | 341/59 |
| 5,936,558 A * | 8/1999 | Shafiee et al. | 341/59 |
| 5,949,357 A | 9/1999 | Fitzpatrick et al. | 341/68 |
| 6,011,497 A * | 1/2000 | Tsang et al. | 341/59 |
| 6,081,210 A * | 6/2000 | Nikolic et al. | 341/59 |

FOREIGN PATENT DOCUMENTS

WO  WO 98/44636  10/1998

OTHER PUBLICATIONS

J. Moon and B. Brickner, "Maximum Transition Run Codes for Data Storage Systems", IEEE Transactions on Magnetics, vol. 32, No. 5, pp. 3992–3994, Sep. 1996.

T. Conway and J. Nelson, "A New Coding Method to Increase SNR on the Magnetic Recording Channel", IEEE Global Telecom. Conferences, vol. 1, pp. 363–367, 1996.

K. Fitzpatrick and C. Modlin, "Time–Varying MTR Codes for High Density Magnetic Recording", IEEE Globecom Conf., Phoenix, AZ Nov. 4–8, 1997.

B. Brickner and J. Moon, "Design of a Rate 6/7 Maximum Transition Run Code", in Proc. 1997 IEEE Int. Magnetics Conf. (New Orleans, LA, Apr. 1–4); also IEEE Trans. Magn., vol. 33, pt. 1, pp. 2749–2751, Sep. 1997.

(List continued on next page.)

Primary Examiner—Peguy JeanPierre
Assistant Examiner—Jean Bruner JeanGlaude
(74) Attorney, Agent, or Firm—Westman, Champlin & Kelly, P.A.

(57) ABSTRACT

A data storage channel encoder includes a data word input, a code word output and an encoder. The encoder is coupled between the data word input and the code word output and is adapted to encode successive data words received on the data word input into successive code words on the code word output according to a selected code having combined maximum transition run and parity constraints. The maximum transition run constraint constrains the successive code words such that, when the successive code words are concatenated to form an encoded bit stream, the encoded bit stream has a maximum of one consecutive transition beginning at either odd or even indexed bit positions in the encoded bit stream and a maximum of two consecutive transitions beginning at the other of the odd or even indexed bit positions.

16 Claims, 8 Draing Sheets

OTHER PUBLICATIONS

B. Moision and P.H. Siegel, "Distance Enhancing Codes for Digital Recording", IEEE Trans. Magn., vol. 33, No. 5, Jan. 1998.

R. Karabed, and P.H. Siegel, "Constrained Coding for Binary Channels with High Intersymbol Interference," IEEE Transaction on Information Theory, vol. 45, No. 6, Sep. 1999.

B. Brickner and J. Moon, "Investigation of Error Propagation in DFE and MTR (1/2;k) Coding for Ultra–High Density", University of Minnesota CDSLab Report, Jul. 10, 1997.

* cited by examiner

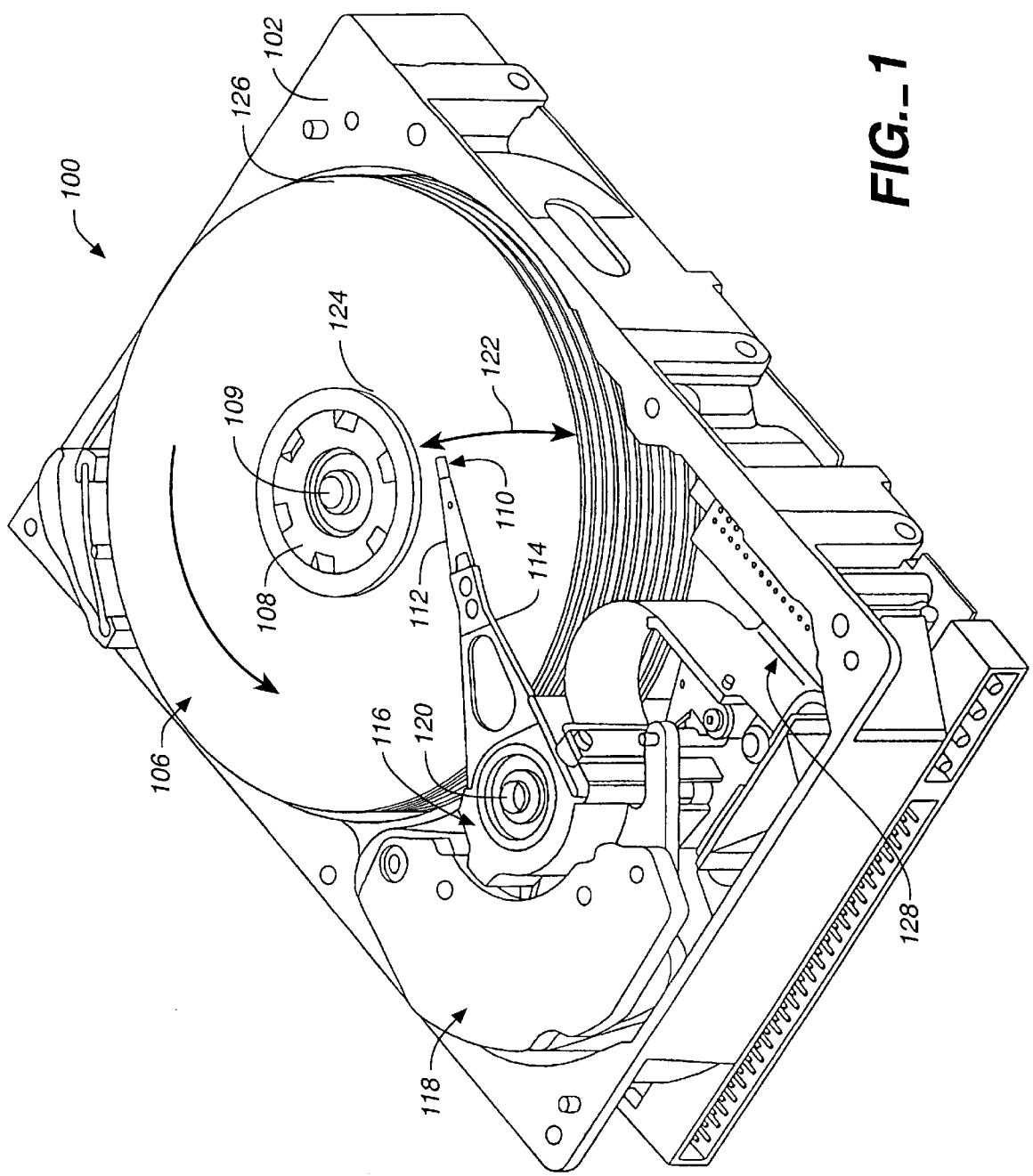
FIG._1

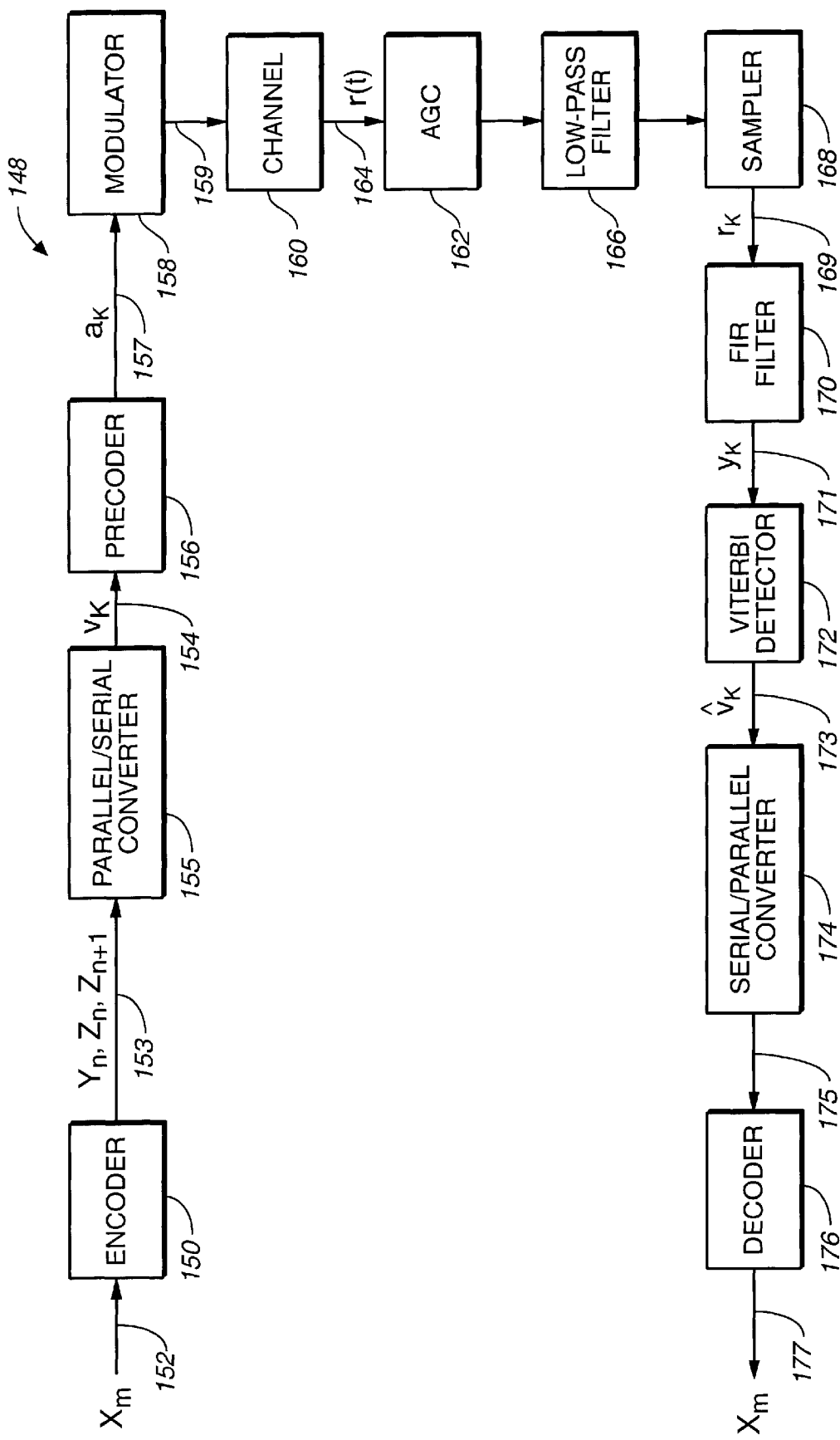
FIG._2

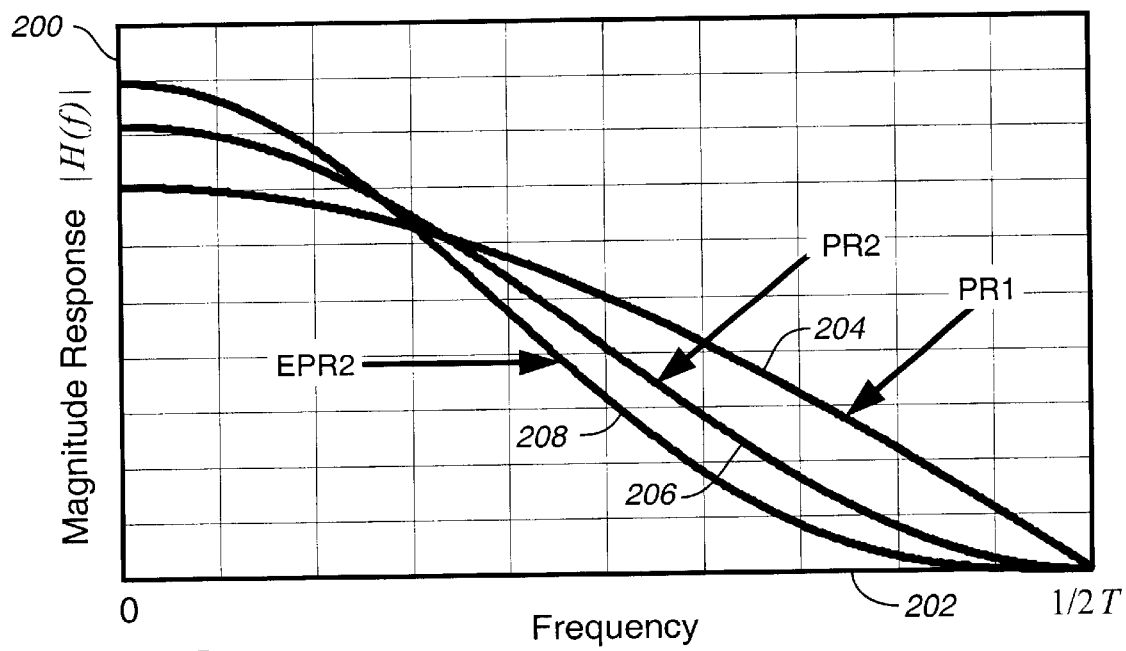
FIG._3
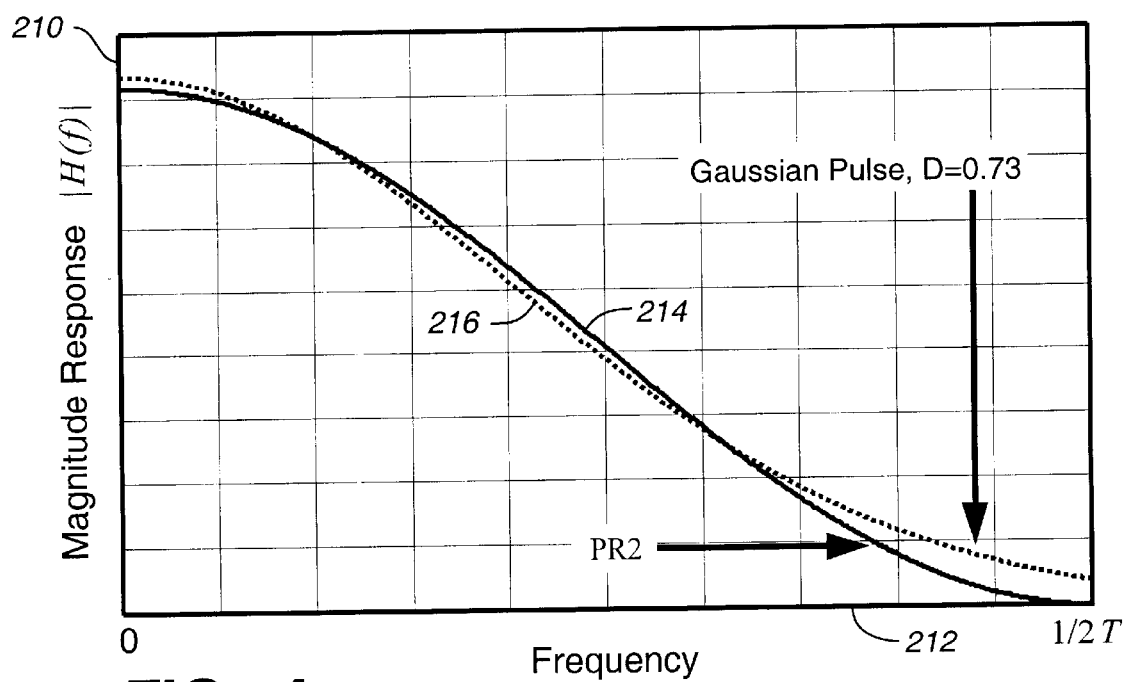
FIG._4

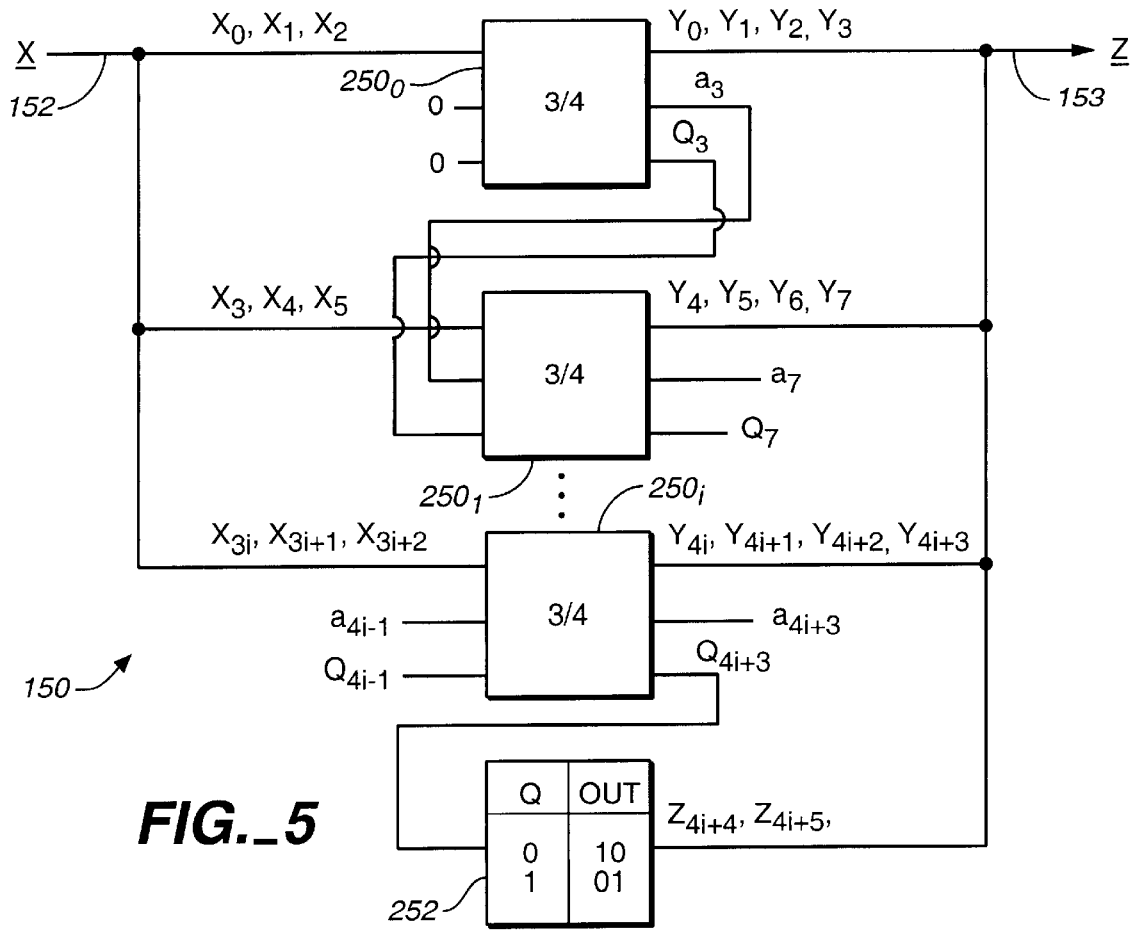
FIG._5
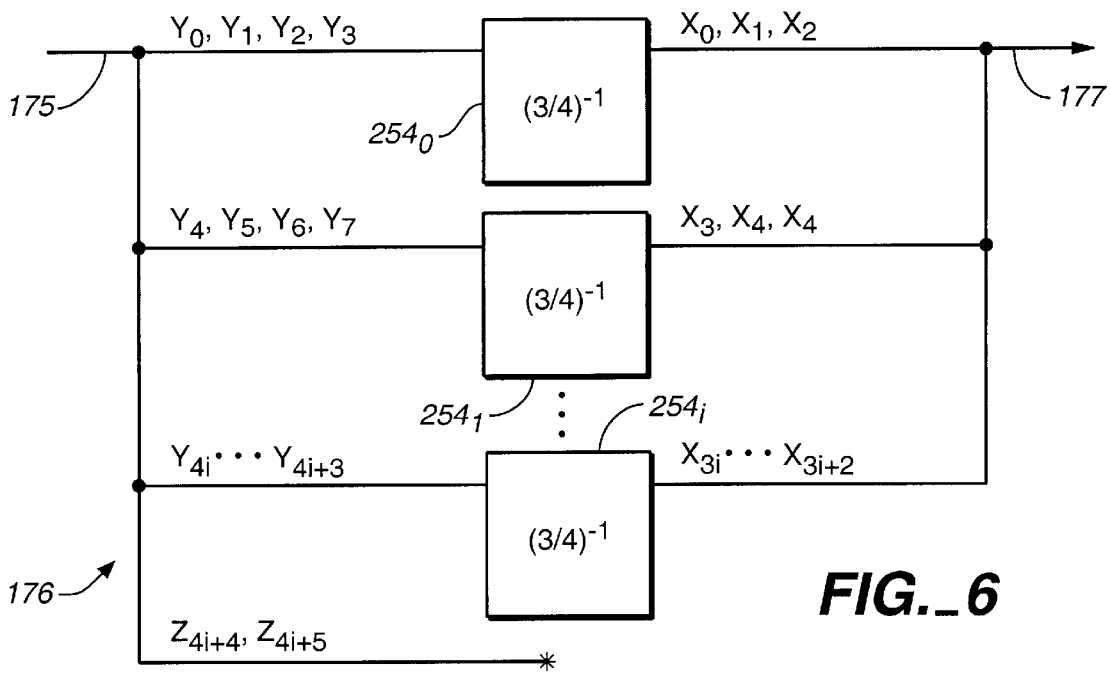
FIG._6

|     | 261 | | | | 263 | | 262 | | | |
| --- | --- | --- | --- | --- | --- | --- | --- | --- | --- | --- |
| 269 → | 1 | 2 | 1 | 2 | 1 | 2 | 1 | 2 | 1 | 2 |
| 268 → | 0 | E | 0 | E | 0 | E | 0 | E | 0 | E |
| 267 → | 1 | 2 | 3 | 4 | 5 | 6 | 7 | 8 | 9 | 10 |
| 266 → | 3 | 2 | 1 | 0 | X | X | 3 | 2 | 1 | 0 |
| 260 → | 1 | 0 | 0 | 1 | 0 | 1 | 1 | 0 | 1 | 0 |
| 270 → | 1 | 1 | 1 | 0 | 0 | 1 | 0 | 0 | 1 | 1 |
| 271 → | 1 | 0 | 1 | 1 | X | X | 0 | 0 | 1 | 1 |

FIG._7

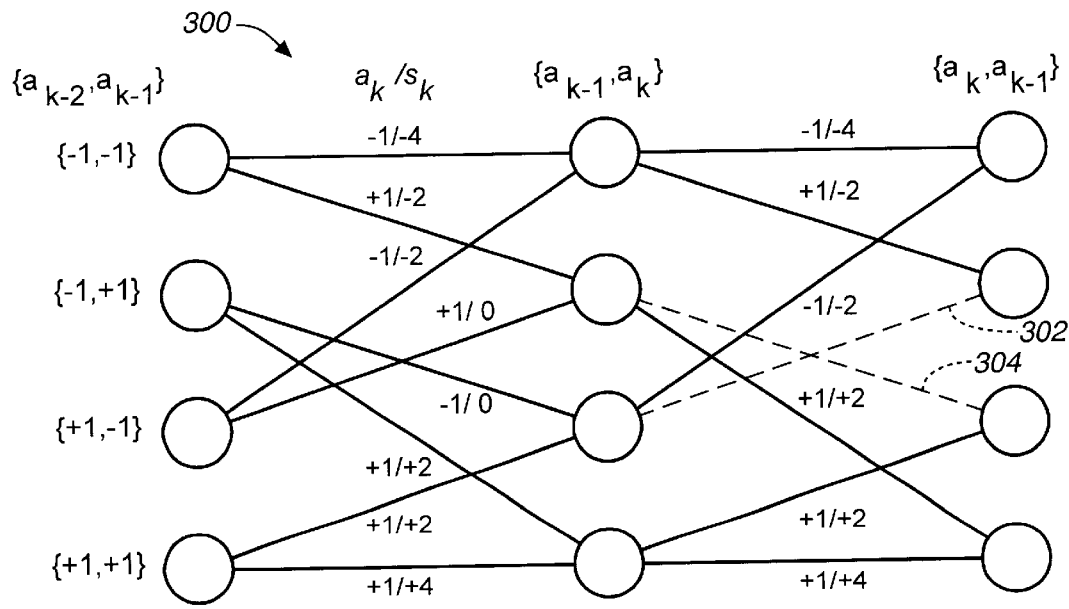
FIG._8
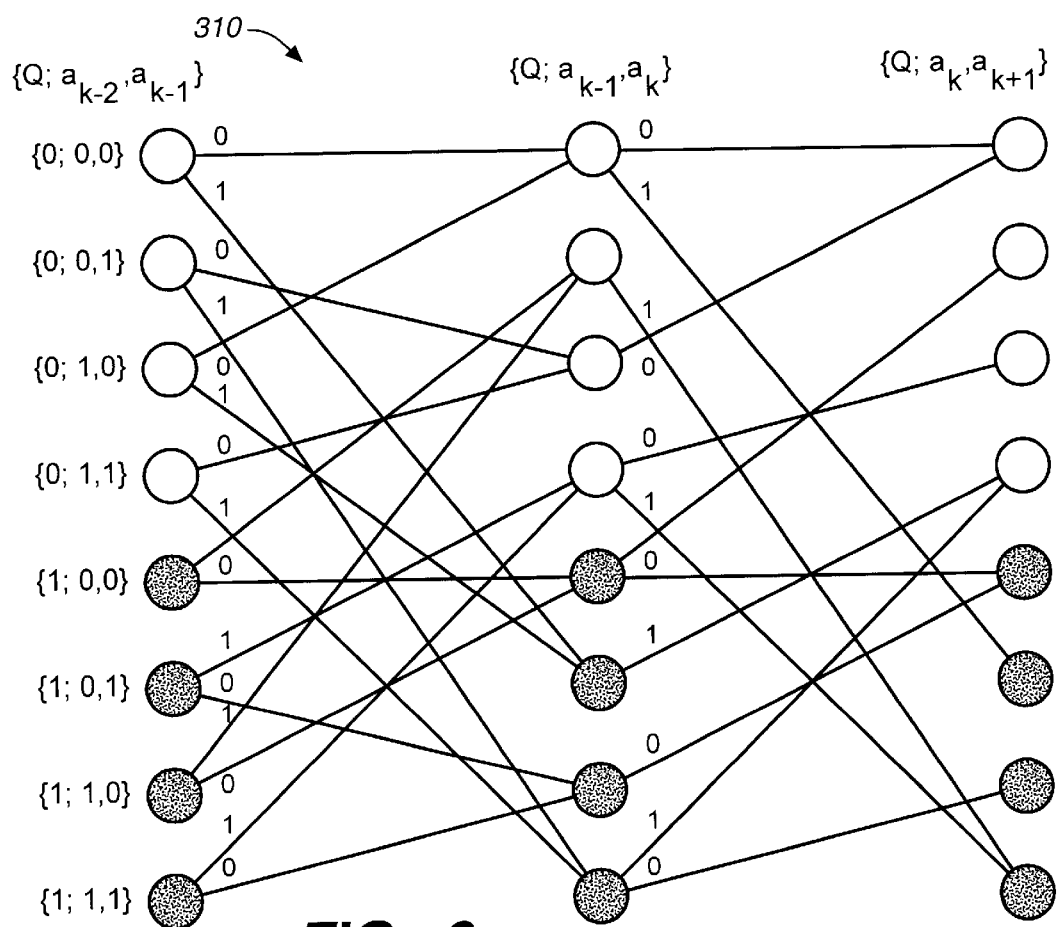
FIG._9

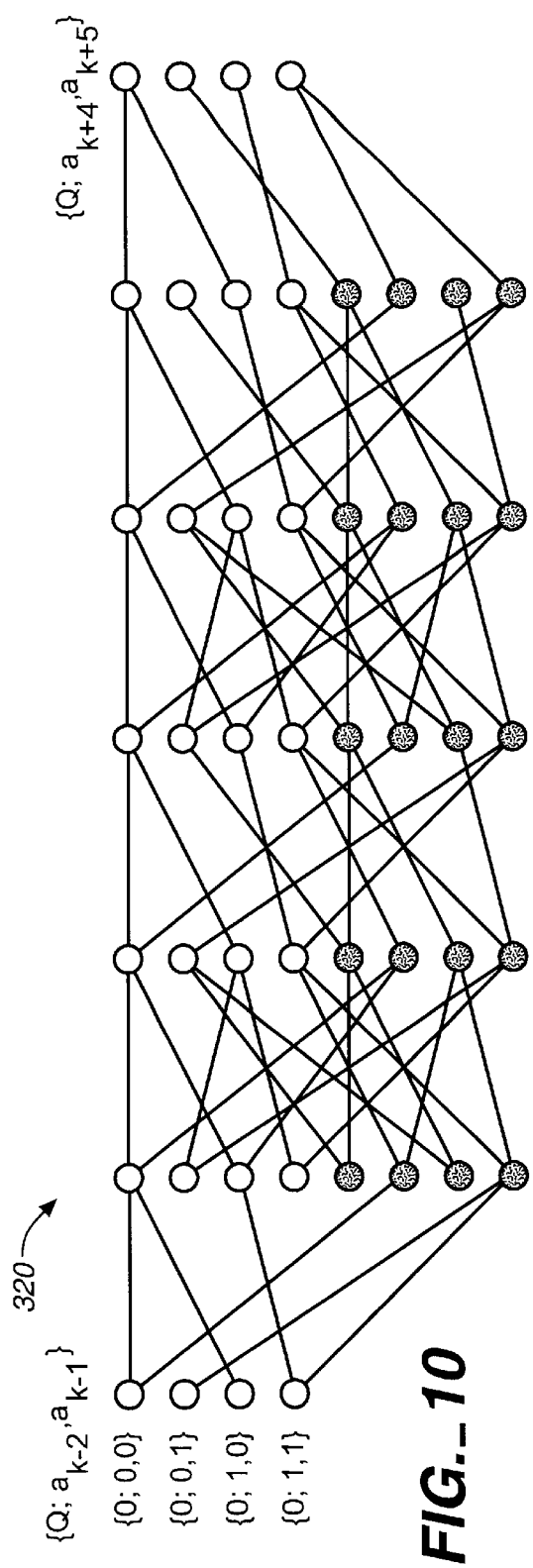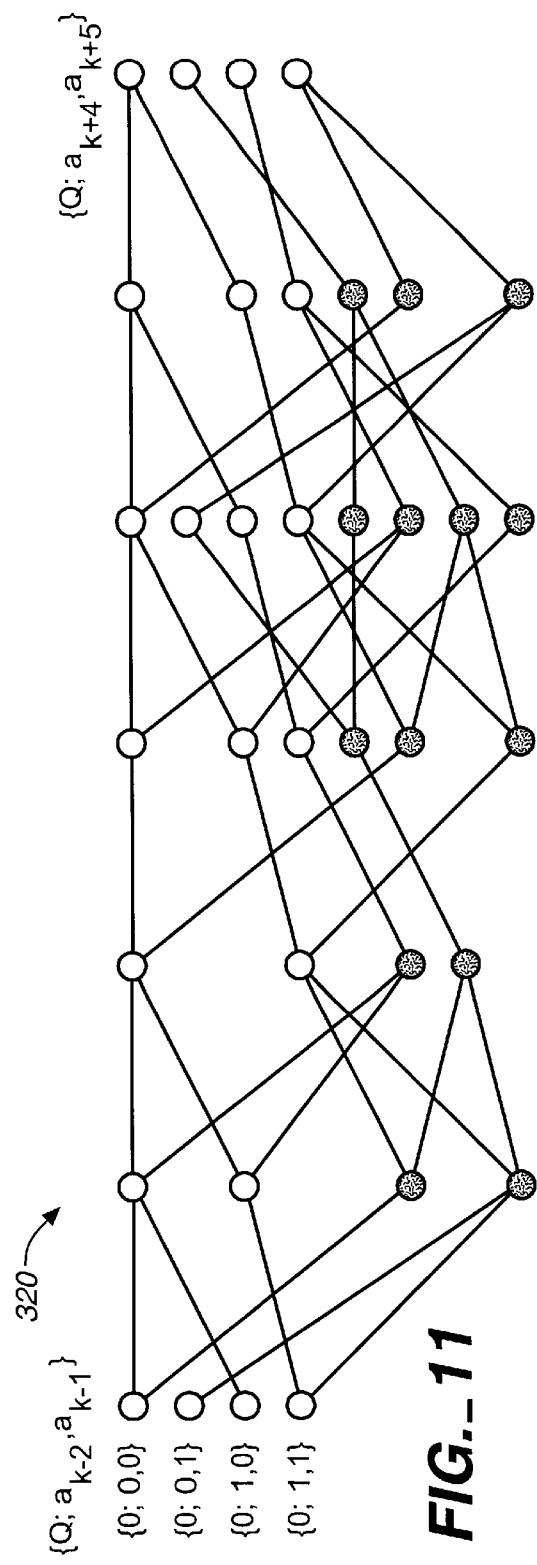
FIG._10
FIG._11

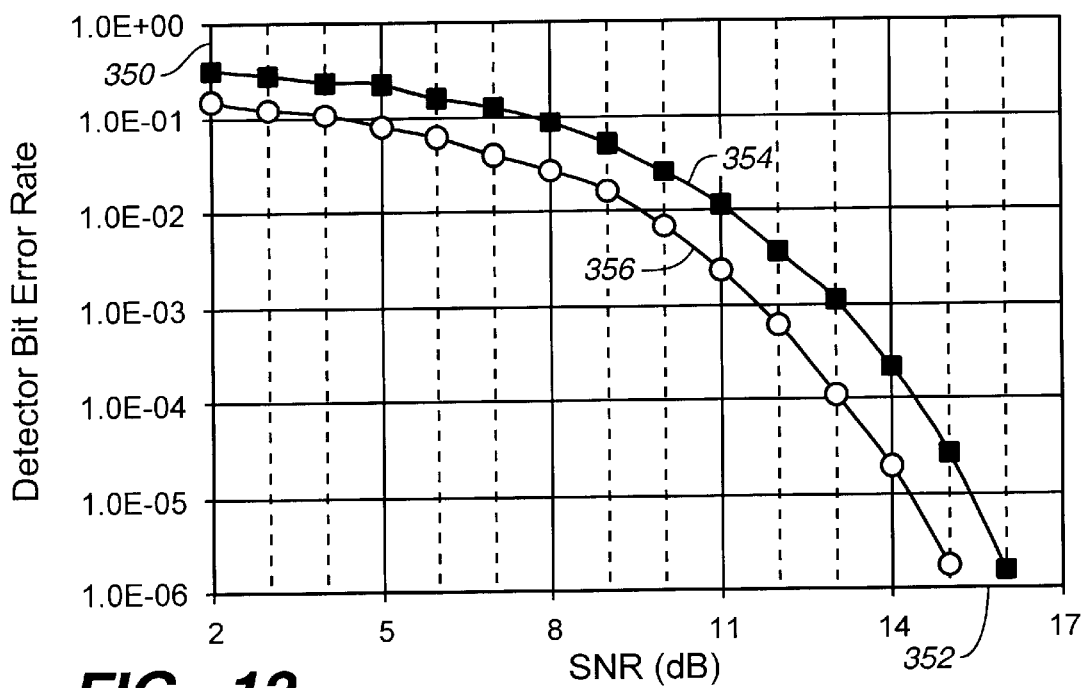
FIG._12
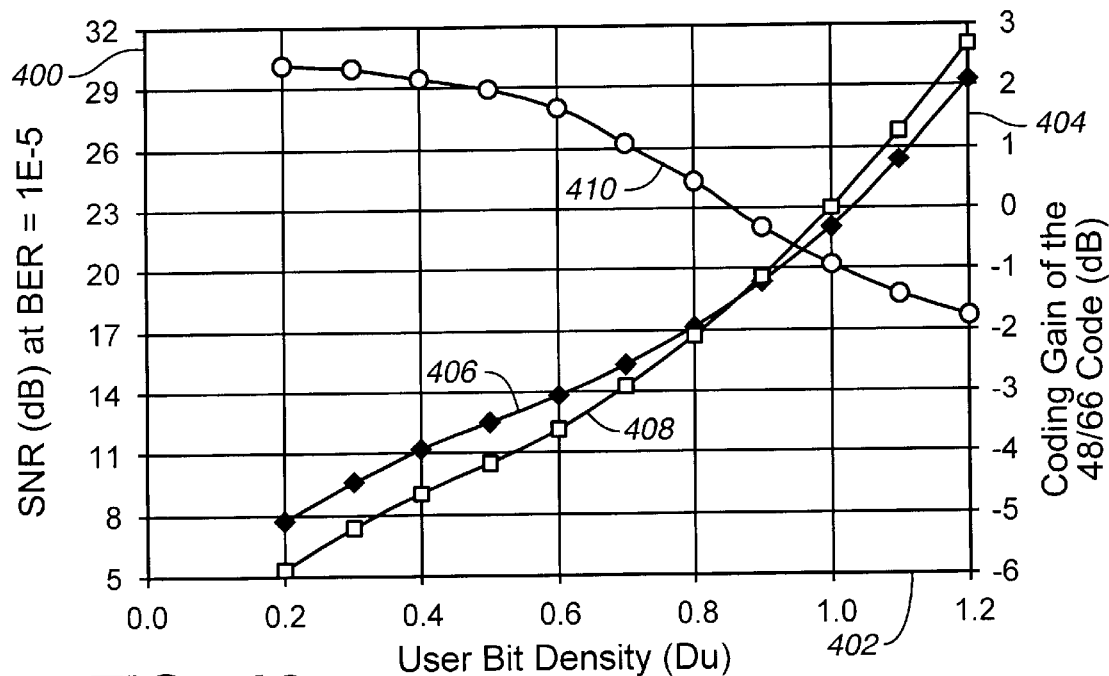
FIG._13

PARTIAL RESPONSE CHANNEL HAVING COMBINED MTR AND PARITY CONSTRAINTS

CROSS-REFERENCE TO CO-PENDING APPLICATION

The present application claims priority benefits from U.S. Provisional Patent Application No. 60/141,622, entitled "MTR+PARITY CODES FOR PR2 CHANNELS" and filed on Jun. 30, 1999.

BACKGROUND OF THE INVENTION

The present invention relates to digital communications systems and, more particularly, to an encoding and decoding system in a disc drive or other data storage system.

In the field of digital communication systems, digital information is conveyed from a transmitter to a receiver through a channel. "Channel" is a generalized term that can include many different mediums, such as recording media, telephone lines and electromagnetic spectrum. In data storage systems, such as magnetic disc drives, the channel includes a storage medium, and the digital information is transmitted to the storage medium and stored for some period of time before being recovered and delivered to the receiver.

A typical magnetic disc drive includes one or more rigid discs mounted for rotation on a hub or spindle. Each disc has an associated head formed of a hydrodynamic bearing and a transducer, for communicating with the surface of the disc. An electromechanical actuator moves the data head radially over the disc surface for track seek operations and holds the transducer directly over a desired track on the disc surface for track following operations. A drive controller controls the disc drive based on commands received from a host system to retrieve information from the discs and to store information on the discs. The drive controller includes various subsystems, such as a "host interface" for communicating with the host system, a "servo subsystem" for controlling the actuator, a "write channel" for recording data on a storage medium, and a "read channel" for receiving recorded data from the storage medium.

Information is typically stored in concentric data tracks on the disc surface. The direction of current through the transducer is controlled to encode magnetic flux reversals on the surface of the disc within the selected data track. In one type of coding, known as non-return-to-zero-inverse (NRZI) coding, a digital "one" is represented by a magnetic flux reversal from one magnetic domain to the next in the data track, and a digital "zero" is represented by a lack of a magnetic flux reversal from one magnetic domain to the next.

In retrieving data from the disc, the servo subsystem controls the electromechanical actuator so that the data head flies over the desired data track, senses the flux reversals stored in the data track, and generates a read signal based on those flux reversals. The read signal is typically conditioned and then decoded by the read channel to recover the data represented by the flux reversals. A typical read channel includes automatic gain control circuitry, a low-pass filter, an analog-to-digital converter or sampler, a sequence detector and a decoder.

The pulse response of the channel has conventionally been equalized to a suitable partial response (PR) target of the form $(1-D)^m (1+D)^n$, wherein m and n are positive integers and D is a delay operator. A number of different PR targets have been developed, such as partial response class 2 (PR2), partial response class 4 (PR4), extended partial response class 4 (EPR4), and enhanced extended partial response class 4 ($E^2PR4$) channels.

A Viterbi detector has been used in the past for the data detector in the read channel. A Viterbi detector acts as a maximum-likelihood (ML) sequence detector when the input to the detector consists of a signal plus additive white, Gaussian noise, and when a typical branch metric (the square of the error in the signal provided to the detector) is used. The detected bit sequence is then passed to the decoder for decoding into the original user data.

All channels, including disc drive storage channels, introduce noise into the signals they convey. To detect and some times correct signal errors caused by channel noise, a large number of coding techniques have been developed. These coding techniques convert user data words formed of a number of data bits into code words formed of a number of code bits. Coding constraints imposed in the code words can be designed to avoid bit sequences that are prone to generating error events and can permit the detection and sometimes the correction of errors in the signals received from the channel.

The average ratio of the number of user data bits to the number of code bits is known as the code rate of the code. In general, the ability to detect and correct errors in a received channel may be increased as the code rate decreases because a lower code rate means a greater amount of redundant information in the code word. However, each additional bit added by the encoder increases the time and energy needed to transmit the signal through the channel.

Several types of constraints have been proposed. For example, in a disc drive, the rotational speed of the spindle motor that rotates the magnetic media varies over time. This results in non-uniform time intervals between read signal voltage pulses. A phase-locked loop (PLL) is used to lock the phase and frequency of the read timing clock to the phase and frequency of the read signal voltage pulses. To ensure that the PLL is updated regularly, a code can be used that limits the number of consecutive zeros in the read signal to no greater than a maximum number "k". This kind of code is known as a run-length-limited (RLL) code with a "k" constraint. The smaller value of "k", the better the performance of the PLL. However, the smaller the value of "k", the more difficult the code becomes to implement.

The code may also limit the number of consecutive ones in an encoded bit stream to limit the effects of inter-symbol interference, which occurs when consecutive transitions in the transmitted signal interfere with each other. Such codes are known as maximum transition run (MTR) codes with a "j" constraint, where "j" is the maximum number of consecutive transitions allowed in the channel signal. For example, to avoid three or more consecutive transitions, codes with an MTR constraint j=2 can be designed. Although MTR codes reduce inter-symbol interference, they eliminate a large number of available code words making it difficult and sometimes impossible to implement MTR constraints with high code rates.

As data storage technology continues to advance, there is a desire to increase the aerial density of the data storage system or to relax the manufacturing tolerances of the systems components while maintaining the same density. Increasing the aerial density or relaxing the manufacturing tolerances requires an increase in the signal-to-noise ratio (SNR) within the data storage channel. Alternatively, attempts can be made to increase the effective SNR as seen by the detector through improvements in the channel coding scheme and in the detector.

Certain data storage devices can be modeled as low-pass channels. For example, magneto-optical channels are often modeled as having a Gaussian impulse response. Perpendicular magnetic recording channels exhibit a similar response. Longitudinal recording channels have some low-pass characteristics, but are more accurately modeled as band-pass channels with a null at D.C. When applied to true low-pass channels, existing modulation codes provide little or no SNR improvement over an uncoded channel. A coding scheme is therefore desired that is capable of obtaining a particular bit error rate with less required SNR for certain low-pass channels.

The present invention addresses these and other problems, and offers other advantages over the prior art.

SUMMARY OF THE INVENTION

One aspect of the present invention relates to a data storage channel encoder, which includes a data word input, a code word output and an encoder. The encoder is coupled between the data word input and the code word output and is adapted to encode successive data words received on the data word input into successive code words on the code word output according to a selected code having a combined maximum transition run and parity constraint. The maximum transition run constraint constrains the successive code words such that, when the successive code words are concatenated to form an encoded bit stream, the encoded bit stream has a maximum of one consecutive transition beginning at either odd or even indexed bit positions in the encoded bit stream and a maximum of two consecutive transitions beginning at the other of the odd or even indexed bit positions.

In one embodiment, the parity constraint generates at least one parity bit on the code word output for each set of p successive code words, wherein p is a positive integer variable that is greater than zero. For example, two parity bits can be used, which can include a binary "10" or a binary "01", depending upon the parity of the set of successive code words. In one example, the encoder is adapted to encode successive 3-bit data words received on the data word input into successive 4-bit code words on the code word output according to the selected code.

Another aspect of the present invention relates to a method of encoding successive data words into successive code words for transmission through a channel. The method includes mapping each successive data word into a corresponding one of the code words according to a selected code. The successive code words are concatenated to form an encoded bit stream having a plurality of even and odd indexed bit positions. A maximum transition run constraint is imposed on the selected code such that the encoded bit stream has a maximum possible run of one consecutive transition beginning in either one of the even or odd indexed bit positions in the encoded bit stream and has a maximum possible run of two consecutive transitions beginning in the other of the even or odd indexed bit positions in the encoded bit stream. A parity constraint is also imposed on the selected code.

Another aspect of the present invention relates to a data storage read channel for use in detecting successive code words in a storage channel output, the successive code words being encoded according to a code. The read channel includes a likelihood sequence detector, which is adapted to detect the successive code words. The detector has a detection sequence that effectively disallows detection of bit sequences in the storage channel output having greater than one consecutive transition beginning at either odd or even indexed bit positions in the bit sequence, bit sequences in the channel output having greater than two consecutive transitions beginning at the other of the odd or even indexed bit positions, and bit sequences in the channel output having a disallowed parity.

Yet another aspect of the present invention relates to a disc drive storage channel, which includes a transducer and an encoder. The transducer is capable of communicating with a data storage disc. The encoder is coupled to the transducer for encoding successive data words into successive code words according to a selected code to form an encoded bit stream, pre-coding the encoded bit stream and applying the pre-coded bit stream to the transducer as a channel input.

In one embodiment, the encoder constrains the successive code words such that encoded bit stream has a maximum of one consecutive transition beginning at either odd or even indexed bit positions in the encoded bit stream and a maximum of two consecutive transitions beginning at the other of the odd or even indexed bit positions and enforces a selected parity constraint on the channel input.

BRIEF DESCRIPTION OF THE DRAWINGS

FIG. 1 is a perspective view of a disc drive having a storage channel that implements combined MTR and parity constraints, according to one embodiment of the present invention.

FIG. 2 is a block diagram of a generalized communication system according to one embodiment of the present invention, which can be formed within disc drive, for example.

FIG. 3 is a graph illustrating frequency response H(f) for PR1, PR2, and EPR2 channels as a function of frequency over the frequency band 1/2T.

FIG. 4 is a graph illustrating a comparison between the response for a PR2 channel and the response for a Gaussian channel at $D_S$=0.73 as a function of frequency.

FIG. 5 is a block diagram, which logically illustrates a block encoder in which a plurality of rate 3/4 encoding functions are concatenated with one another and with a two-bit parity sequence, according to one embodiment of the present invention.

FIG. 6 is a diagram, which logically illustrates the function performed by a decoder in the communication system shown in FIG. 2, according to one embodiment of the present invention.

FIG. 7 is a diagram illustrating an example of the calculation and concatenation of parity bits in a sample code word stream.

FIG. 8 shows an example of trellis state machine diagram section for an MTR(1/2;k) coded PR2 channel.

FIG. 9 shows a trellis section of length three, which has been modified to include the parity "Q" of the path for each state.

FIG. 10 shows a trellis section that is extended to include a six-bit code word (a rate 3/6 code from the previous example) and in which the states corresponding to odd parity have been removed.

FIG. 11 shows the trellis section of FIG. 10 with all unused states removed.

FIG. 12 is a graph illustrating a comparison of detector error rate as a function of SNR for a rate 48/66 code according to one embodiment of the present invention and for a standard rate 16/17 RLL(0,6/6) code of the prior art.

FIG. 13 is a graph illustrating SNR at a bit error rate of $1\times10^{-5}$ as a function of density for the coding schemes compared in FIG. 12.

DETAILED DESCRIPTION OF ILLUSTRATIVE EMBODIMENTS

The present invention provides a coding scheme having combined maximum transition run (MTR) and a parity constraints to provide a coding gain in certain low-pass partial response (PR) channels. In one embodiment, the MTR constraint limits the number of consecutive transitions in the code words to two and limits the number of consecutive transitions in the code words to one when the transition occurs at either an even bit position or an odd bit position (but not both). The parity constraint forces the number of pre-coded positive channel bits to be even or odd.

The combined MTR and parity constraints increase the minimum Euclidean (geometrical) distance between paths through a Viterbi trellis in the read channel by approximately 4 dB when compared with the uncoded case. For certain channels, a coding gain (i.e., an increase in the minimum distance) will result when the distance gain is adjusted for a lower code rate required by the code constraints. The following discussion illustrates an example of the present invention where a net gain of 2 dB in minimum distance is obtained.

FIG. 1 is a perspective view of a disc drive 100 having a storage channel that implements combined MTR and parity constraints, according to one embodiment of the present invention. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated head 110, which is mounted to disc drive 100 for communication with the disc surface. In the example shown in FIG. 1, heads 110 are supported by suspensions 112, which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along a path 122 between an inner disc diameter 124 and an outer disc diameter 126. Voice coil motor 118 operates under control of internal circuitry 128.

Write circuitry within internal circuitry 128 encodes the data to be stored into successive code words, which are then precoded into a non-return-to-zero- inverse (NRZI) format (or, alternatively, an NRZ format) and modulated to form a serial analog write signal. The write transducer on head 110 encodes magnetic flux reversals within a magnetic layer on the disc surface based on the analog write signal. During read operations, the read transducer in head 110 senses the magnetic flux reversals and generates a serial analog read signal. The analog read signal is converted into a serial digital signal, which is provided to detector and decoder circuitry within internal circuitry 128 to produce a recovered data signal.

FIG. 2 is a block diagram of a generalized communication system 148 according to one embodiment of the present invention, which can be formed within disc drive 100, for example. Communication system 148 includes an encoder 150, which receives successive user data words $X_m=[x_0, x_1, \ldots, x_{m-1}]$ on input 152 and encodes the successive data words into successive code words $Y_n=[y_0, y_1, \ldots, y_{n-1}]$ on output 153. The variable m is a positive integer variable indicating the number of symbols or bits in each data word. The variable n is a positive integer variable indicating the number of symbols or bits in each code word. Each data word can include any number of symbols. In a binary system, for example, each symbol represents one logical data bit. In disc drive applications, common data word lengths are 4, 8 or 16 bits. As described in more detail below, successive user data words $X_m$ are encoded into successive code words $Y_n$ using a maximum transition run (MTR) code with a "j" constraint and a parity constraint. Encoder 150 enforces the parity constraint in each code word (or string of code words) by adding two bits $z_n$ and $z_{n-1}$ to the successive code words $Y_n$ (or string of code words) at output 153. The bits $z_n$ and $z_{n+1}$ are selected such that each code word (or string of code words) have either an even parity or an odd parity after being precoded into an NRZI or NRZ format for transmission through the channel.

Encoder 150 includes combination logic or a state machine, for example, to ensure that code words are produced which avoid undesirable sequences of binary symbols. In alternative embodiments, encoder 150 can be implemented in software with a look-up table for making the conversion between each user data word and its corresponding code word. Other hardware and software implementations can also be used.

Parallel-to-serial converter 155 receives the successive code words (with the two parity bits) from output 153, converts each code word into a serial representation and concatenates the serial representations to produce a serial stream of code word bits $V_K$ on output 154. Pre-coder 156 receives the serial code word stream $V_K$ from output 154 and conditions the sequence so that it is optimized for the type of detector used to recover the signal from the channel. In one embodiment, pre-coder 156 conditions the sequence to implement an NRZI modulation scheme in which a binary "zero" represents no transition or flux reversal on the magnetic medium, and a binary "one" represents a transition. In another embodiment, an NRZ modulation scheme is used in which a binary "one" represents one write current polarity, and a binary "zero" represents the opposite polarity. Precoder 156 produces a precoded write signal vector $a_k$ on output 157, where "k" is a time index that ranges from zero to infinity. The precoded write signal $a_k$ on output 157 is provided to modulator 158, which generates a write signal 159 that is provided to channel 160. The modulated write signal is bipolar, with values contained in the set $\{-1,+1\}$ to implement the selected modulation scheme.

Channel 160 includes a write current amplifier, the write transducer in head 110, disc pack 106, and the read transducer in head 110 (shown in FIG. 1). The modulated write signal is stored on the disc surface in the form of magnetic flux reversals by the write transducer. During a read operation, the read transducer in head 110 reads the stored, encoded information from the disc surface and conveys the encoded information to automatic gain controller 162 as a read signal r(t) at channel output 164.

Automatic gain controller 162 maintains the amplitude of read signal r(t) within an expected range and provides it to low-pass filter 166. Low-pass filter 166 filters out high frequency components and provides the filtered read signal r(t) to sampler 168. Sampler 168 can include an analog-to-digital (A/D) converter, for example, which converts the filtered read signal r(t) into a sequence of digital read symbols $r_k$, on output 169, which are provided to finite impulse response (FIR) filter 170. FIR filter 122 equalizes the sequence of digital read symbols $r_k$ into a target response. FIR filter 122 produces an observation variable $y_k$ at output 171, which is processed by a Viterbi algorithm in Viterbi detector 172.

The Viterbi algorithm in Viterbi detector 172 operates to approximate a maximum likelihood sequence detector (MLSD) for detecting the most likely bit sequence received from channel 160. In one embodiment, Viterbi detector 172 implements a trellis state machine diagram, as discussed in more detail below. The trellis is modified to disallow states or branches based on the MTR and parity constraints imposed by encoder 150.

The detected bit sequence $\hat{a}_k$ is then provided to a postcoder within the detector (or alternatively external to the detector), which applies the inverse of the precoding function within pre-coder 156 to generate a detected bit sequence $\hat{V}_K$. The detected bit sequence $\hat{V}_K$ is provided to serial-to-parallel converter 174, which groups the bits into code words and converts the code words from a serial format to a parallel format. Successively recovered code words on output 175 have lengths corresponding to the lengths of the code words generated by encoder 150. Decoder 176 uses the inverse of the coding rules imposed by encoder 150 to convert the successive code words into respective user data words on output 177.

Simulation Example

Communication system 148 shown in FIG. 2 was modeled for a PR2 channel, for example, to illustrate that a code having combined MTR and parity constraints can achieve a net coding gain of 2 dB for a low-pass PR2 channel.

1. Channel Model

Certain types of low-pass channels, such as those used in magneto-optical recording and perpendicular recording have Gaussian impulse response characteristics. The impulse response f(t) of these channels is represented by $$f(t) = \frac{1}{T_0\sqrt{2\pi}} e^{-(t/T_0)^2/2}. \qquad \text{Eq. 1}$$

where t is time, and $T_0$ is a constant. Digital data are transmitted in the form of positive and negative pulses at the input to channel 160 (shown in FIG. 2). A measure of the inter-symbol interference (ISI) or linear symbol density is defined as $D_S=T_0/T$, where T is the baud period of the digital data. The continuous time channel response h(t) of channel 160 then has the form $$h(t) = \int_{t-T}^{t} f(\tau)d\tau. \qquad \text{Eq. 2}$$

Assuming that the channel input data pulses are bipolar with values $a_k \in \{-1, +1\}$, which are corrupted by an additive white Gaussian noise (AWGN) signal n(t), the read signal r(t) is written as $$r(t) = \sum_{k=-\infty}^{\infty} a_k h(t-kT) + n(t). \qquad \text{Eq. 3}$$

Because channel 160 has a low-pass frequency response, matched filter 166 is also low-pass. At this point, a Butterworth type low pass filter (LPF) is substituted for a matched filter for the following simulations, without proof of optimality. Except for very low densities, the amount of energy out of the 1/2T bandwidth is negligible. Accordingly, the response h(t) is filtered with a 7th order Butterworth filter with a −3 dB point at 1/2T and sampled at the baud rate by sampler 168 (also shown in FIG. 2) to produce an effective sampled channel response $h_k$. Assuming that the noise introduced by channel 160 is bandlimited and sampled, a baud rate channel model is given by $$r_k = \sum_{i=-\infty}^{\infty} a_i h_{k-i} + n_k. \qquad \text{Eq. 4}$$

As with most storage channels, defining SNR is problematic because the signal energy varies nonlinearly with density $D_S$. Therefore, the following ad hoc definition is adopted for purposes of illustration:

$$SNR \equiv \frac{1}{\sigma_n^2/D_S} \qquad \text{Eq. 5}$$

where $\sigma_n^2$ is the variance of the noise n(t). This is simply the reciprocal of the noise power in the 1/2T frequency band at a normalized density of $D_S=2$. This allows coding schemes operating at different rates (and, therefore, densities) to be compared on the basis of information density for a fixed channel response.

2. Receiver Model

A seventh order Butterworth filter with −3 dB point at 1/2T is used in this example as the front-end low-pass filter 166. Following sampler 168, discrete-time FIR 170 further equalizes the read signal. For a vector of received samples, $r_k=[r_k, r_{k-1}, \ldots, r_{k-L-1}]^T$, the FIR "c" vector with length L and delay $\Delta$ produces an observation variable, $$y_k = c^T r_{k+\Delta}. \qquad \text{Eq. 6}$$

The observation variable $y_k$ is then processed using the Viterbi Algorithm implemented by Viterbi detector 172 as an approximation of a maximum likelihood sequence detector (MLSD). For practical reasons, the length of the channel response $f=c^T h$ is often constrained to a predetermined partial response. For low pass channels, some suitable target responses are PR1 (f(D)=1+D), PR2 (f(D)=1+2D+D$^2$), and EPR2 (f(D)=1+3D+3D$^2$+D$^3$). For the simulation example described herein, FIR 170 is designed using a least-mean-square (LMS) adaptation to arrive at a minimum mean square error (MMSE) equalizer. The MMSE criterion is characterized by $$\min_c E\{(c^T r_{k+\Delta} - f^T a_k)^2\}. \qquad \text{Eq. 7}$$

The frequency response H(f) for PR1, PR2, and EPR2 are shown as a function of frequency over the frequency band 1/2T in FIG. 3. The magnitude of the frequency response H(t) is plotted along axis 200, and the frequency, f, is plotted along axis 202. Line 204 represents the frequency response of a PR1 polynomial, line 206 represents the frequency response of a PR2 polynomial, and line 208 represents the frequency response of an EPR2 polynomial. FIG. 4 is a graph illustrating the magnitude of the response along axis 210 as a function of frequency along axis 212. Line 214 represents the frequency response of the PR2 polynomial, and line 216 represents the frequency response for the Gaussian channel at $D_S=0.73$. Clearly, PR2 polynomial 214 is an appropriate response at the chosen density. For lower densities, PR1 is appropriate, and EPR2 is useful at higher densities, for example.

3. Minimum Distance Analysis

Once a partial response target is chosen, a profile of the most likely error events and their relative probabilities can be computed using the assumption of AWGN (i.e., noise correlation from the equalization is ignored). The assumptions provide a reasonable starting point for pragmatic analysis. Monte Carlo simulations of channel 160 and the receiver elements can be used to provide a more accurate description of the error mechanisms. The profile computed below can be used to determine the code constraints and to estimate the corresponding gain.

Maximum likelihood sequence detection for linear channels with AWGN is based on a metric that measures the Euclidean (geometrical) distance between an input sequence and the received sequence. The detector chooses in favor of the sequence with the smallest distance. The most likely error events are those that correspond to an input sequence and a detector output sequence that are separated by a small Euclidean distance. The error rate, or probability of error Pe, for Viterbi detector 172 can be approximated by $$Pe \approx Q\left(\frac{d_{\min}}{2\sigma_n}\right) \quad \text{Eq. 8}$$

where $d_{min}$ is the minimum Euclidean distance over all possible sequences. Therefore, the minimum error event distance is a direct indication of how well system 148 will perform for a given noise power. Moreover, the ratio of the distance associated with two error events is a measure of the likelihood of seeing a particular error event relative to the other.

In general, a closed-form solution cannot be obtained for the minimum distance error event in a given channel. Instead, the distance is contained within two bounds that monotonically approach the minimum distance as the length of the error event considered increases. For the case of PR2, a low-distance error event will exist for a long series of consecutive transitions. This event, which results because of the null response at 1/2T, as shown in FIGS. 3 and 4, can be eliminated by constraining the number of consecutive transitions, which can be accomplished by removing the all-ones NRZI code word from the available code words used by encoder 150. Assuming that these events are removed, the minimum distance bounds give $d_{min}=4$ for error events with $e_k \epsilon \{-2,0,+2\}$. The error event is the difference between the transmitted and detected sequences, $a_k$ and $â_k$, respectively.

Table 1 shows the minimum distance error events for a PR2 channel that have a length L=9 or less and start with $e_k=+2$.

TABLE 1 d = 4.0000 (0.00 dB) e = {2, −2, 0, 0, 0, 0, 0, 0, 0}
d = 4.0000 (0.00 dB) e = {2, −2, 2, −2, 0, 0, 0, 0, 0}
d = 4.0000 (0.00 dB) e = {2, −2, 2, −2, 2, −2, 0, 0, 0}
d = 4.0000 (0.00 dB) e = {2, −2, 2, −2, 2, −2, 2, −2, 0}
d = 4.0000 (0.00 dB) e = {2, −2, 2, −2, 2, −2, 2, −2, 2}
d = 4.0000 (0.00 dB) e = {2, −2, 2, −2, 2, −2, 2, 0, 0}
d = 4.0000 (0.00 dB) e = {2, −2, 2, −2, 2, 0, 0, 0, 0}
d = 4.0000 (0.00 dB) e = {2, −2, 2, 0, 0, 0, 0, 0, 0}
d = 4.8990 (1.76 dB) e = {2, −2, 0, 2, −2, 0, 0, 0, 0}
d = 4.8990 (1.76 dB) e = {2, −2, 0, 2, −2, 2, −2, 0, 0}
d = 4.8990 (1.76 dB) e = {2, −2, 0, 2, −2, 2, −2, 2, −2}
d = 4.8990 (1.76 dB) e = {2, −2, 0, 2, −2, 2, −2, 2, 0}

TABLE 1-continued d = 4.8990 (1.76 dB) e = {2, −2, 0, 2, −2, 2, 0, 0, 0}
d = 4.8990 (1.76 dB) e = {2, −2, 2, −2, 0, 2, −2, 0, 0}
d = 4.8990 (1.76 dB) e = {2, −2, 2, −2, 0, 2, −2, 2, −2}
d = 4.8990 (1.76 dB) e = {2, −2, 2, −2, 0, 2, −2, 2, 0}
d = 4.8990 (1.76 dB) e = {2, −2, 2, −2, 2, −2, 0, 2, −2}
d = 4.8990 (1.76 dB) e = {2, −2, 2, −2, 2, 0, −2, 2, −2}
d = 4.8990 (1.76 dB) e = {2, −2, 2, −2, 2, 0, −2, 2, 0}
d = 4.8990 (1.76 dB) e = {2, −2, 2, 0, −2, 2, −2, 0, 0}
d = 4.8990 (1.76 dB) e = {2, −2, 2, 0, −2, 2, −2, 2, −2}
d = 4.8990 (1.76 dB) e = {2, −2, 2, 0, −2, 2, −2, 2, 0}
d = 4.8990 (1.76 dB) e = {2, −2, 2, 0, −2, 2, 0, 0, 0}
d = 4.8990 (1.76 dB) e = {2, 0, 0, 0, 0, 0, 0, 0, 0}
d = 5.6569 (3.01 dB) e = {2, −2, 0, 0, −2, 2, −2, 0, 0}
d = 5.6569 (3.01 dB) e = {2, −2, 0, 0, −2, 2, −2, 2, −2}
d = 5.6569 (3.01 dB) e = {2, −2, 0, 0, −2, 2, −2, 2, 0}
d = 5.6569 (3.01 dB) e = {2, −2, 0, 0, −2, 2, 0, 0, 0}
d = 5.6569 (3.01 dB) e = {2, −2, 0, 0, 0, −2, 2, −2, 0}
d = 5.6569 (3.01 dB) e = {2, −2, 0, 0, 0, −2, 2, −2, 2}
d = 5.6569 (3.01 dB) e = {2, −2, 0, 0, 0, −2, 2, 0, 0}
d = 5.6569 (3.01 dB) e = {2, −2, 0, 0, 0, 0, −2, 2, −2}
d = 5.6569 (3.01 dB) e = {2, −2, 0, 0, 0, 0, −2, 2, 0}
d = 5.6569 (3.01 dB) e = {2, −2, 0, 0, 0, 0, 0, −2, 2}
d = 5.6569 (3.01 dB) e = {2, −2, 0, 0, 0, 0, 0, 2, −2}
d = 5.6569 (3.01 dB) e = {2, −2, 0, 0, 0, 0, 2, −2, 0}
d = 5.6569 (3.01 dB) e = {2, −2, 0, 0, 0, 0, 2, −2, 2}
d = 5.6569 (3.01 dB) e = {2, −2, 0, 0, 0, 2, −2, 0, 0}
d = 5.6569 (3.01 dB) e = {2, −2, 0, 0, 0, 2, −2, 2, −2}
d = 5.6569 (3.01 dB) e = {2, −2, 0, 0, 0, 2, −2, 2, 0}
d = 5.6569 (3.01 dB) e = {2, −2, 0, 0, 2, −2, 0, 0, 0}
d = 5.6569 (3.01 dB) e = {2, −2, 0, 0, 2, −2, 2, −2, 0}
d = 5.6569 (3.01 dB) e = {2, −2, 0, 0, 2, −2, 2, −2, 2}
d = 5.6569 (3.01 dB) e = {2, −2, 0, 0, 2, −2, 2, 0, 0}
d = 5.6569 (3.01 dB) e = {2, −2, 0, 2, −2, 0, 2, −2, 0}
d = 5.6569 (3.01 dB) e = {2, −2, 0, 2, −2, 0, 2, −2, 2}
d = 5.6569 (3.01 dB) e = {2, −2, 0, 2, −2, 0, 2, 0, −2, 2}
d = 5.6569 (3.01 dB) e = {2, −2, 0, 2, 0, 0, 0, 0, 0}
d = 5.6569 (3.01 dB) e = {2, −2, 2, −2, 0, 0, −2, 2, −2}
d = 5.6569 (3.01 dB) e = {2, −2, 2, −2, 0, 0, −2, 2, 0}
d = 5.6569 (3.01 dB) e = {2, −2, 2, −2, 0, 0, 0, −2, 2}
d = 5.6569 (3.01 dB) e = {2, −2, 2, −2; 0, 0, 0, 2, −2}
d = 5.6569 (3.01 dB) e = {2, −2, 2, −2, 0, 0, 2, −2, 0}
d = 5.6569 (3.01 dB) e = {2, −2, 2, −2, 0, 0, 2, −2, 2}
d = 5.6569 (3.01 dB) e = {2, −2, 2, −2, 0, 2, 0, 0, 0}
d = 5.6569 (3.01 dB) e = {2, −2, 2, −2, 2, −2, 0, 2, 0}
d = 5.6569 (3.01 dB) e = {2, −2, 2, −2, 2, −2, 2, 0, −2}
d = 5.6569 (3.01 dB) e = {2, −2. 2, −2, 2, 0, −2, 0, 0}
d = 5.6569 (3.01 dB) e = {2, −2, 2, −2, 2, 0, 0, −2, 2}
d = 5.6569 (3.01 dB) e = {2, −2, 2, −2, 2, 0, 0, 2, −2}
d = 5.6569 (3.01 dB) e = {2, −2, 2, 0, −2, 0, 0, 0, 0}
d = 5.6569 (3.01 dB) e = {2, −2, 2, 0, −2, 2, 0, −2, 2}
d = 5.6569 (3.01 dB) e = {2, −2, 2, 0, 0, −2, 2, −2, 0}
d = 5.6569 (3.01 dB) e = {2, −2, 2, 0, 0, −2, 2, −2, 2}
d = 5.6569 (3.01 dB) e = {2, −2, 2, 0, 0, −2, 2, 0, 0}
d = 5.6569 (3.01 dB) e = {2, −2, 2, 0, 0, 0, −2, 2, 0}
d = 5.6569 (3.01 dB) e = {2, −2, 2, 0, 0, 0, 0, −2, 2}
d = 5.6569 (3.01 dB) e = {2, −2, 2, 0, 0, 0, 2, −2, 0}
d = 5.6569 (3.01 dB) e = {2, −2, 2, 0, 0, 2, −2, 0, 0}
d = 5.6569 (3.01 dB) e = {2, −2, 2, 0, 0, 2, −2, 2, −2}
d = 5.6569 (3.01 dB) e = {2, −2, 2, 0, 0, 2, −2, 2, 0}
d = 5.6569 (3.01 dB) e = {2, −2, 2, 0, 0, 2, −2, 0, 0}
d = 5.6569 (3.01 dB) e = {2, −2, 2, 0, 0, 2, −2, 2, −2}
d = 5.6569 (3.01 dB) e = {2, −2, 2, 0, 0, 2, −2, 2, 0}
d = 5.6569 (3.01 dB) e = {2, 0, −2, 2, −2, 0, 0, 0, 0}
d = 5.6569 (3.01 dB) e = {2, 0, −2, 2, −2, 2, −2, 0, 0}
d = 5.6569 (3.01 dB) e = {2, 0, −2, 2, −2, 2, −2, 2, −2}
d = 5.6569 (3.01 dB) e = {2, 0, −2, 2, −2, 2, −2, 2, 0}
d = 5.6569 (3.01 dB) e = {2, 0, −2, 2, −2, 2, 0, 0, 0}
d = 5.6569 (3.01 dB) e = {2, 0, −2, 2, 0, 0, 0, 0, 0}
d = 6.3246 (3.98 dB) e = {2, −2, 0, −2, 2, −2, 0, 0, 0}
d = 6.3246 (3.98 dB) e = {2, −2, 0, −2, 2, −2, 2, −2, 0}
d = 6.3246 (3.98 dB) e = {2, −2, 0, −2, 2, −2, 2, −2, 2}
d = 6.3246 (3.98 dB) e = {2, −2, 0, −2, 2, −2, 2, 0, 0}
d = 6.3246 (3.98 dB) e = {2, −2, 0, −2, 2, 0, 0, 0, 0}
d = 6.3246 (3.98 dB) e = {2, −2, 0, 0, −2, 0, 0, 0, 0}
d = 6.3246 (3.98 dB) e = {2, −2, 0, 0, −2, 2, 0, −2, 2}
d = 6.3246 (3.98 dB) e = {2, −2, 0, 0, 0, −2, 0, 0, 0}
d = 6.3246 (3.98 dB) e = {2, −2, 0, 0, 0, 0, −2, 0, 0}
d = 6.3246 (3.98 dB) e = {2, −2, 0, 0, 0, 0, 0, −2, 0}
d = 6.3246 (3.98 dB) e = {2, −2, 0, 0, 0, 0, 0, 0, −2}

TABLE 1-continued d = 6.3246 (3.98 dB) e = {2, -2, 0, 0, 0, 0, 0, 0, 2}
d = 6.3246 (3.98 dB) e = {2, -2, 0, 0, 0, 0, 0, 2, 0}
d = 6.3246 (3.98 dB) e = {2, -2, 0, 0, 0, 0, 2, 0, 0}
d = 6.3246 (3.98 dB) e = {2, -2, 0, 0, 0, 2, 0, 0, 0}
d = 6.3246 (3.98 dB) e = {2, -2, 0, 0, 2, -2, 0, 2, -2}
d = 6.3246 (3.98 dB) e = {2, -2, 0, 0, 2, 0, 0, 0, 0}
d = 6.3246 (3.98 dB) e = {2, -2, 0, 2, -2, 0, 0, -2, 2}
d = 6.3246 (3.98 dB) e = {2, -2, 0, 2, -2, 0, 0, 2, -2}
d = 6.3246 (3.98 dB) e = {2, -2, 0, 2, -2, 0, 2, 0, 0}
d = 6.3246 (3.98 dB) e = {2, -2, 0, 2, -2, 2, -2, 0, 2}
d = 6.3246 (3.98 dB) e = {2, -2, 0, 2, -2, 2, 0, -2, 0}
d = 6.3246 (3.98 dB) e = {2, -2, 0, 2, 0, -2, 2, -2, 0}
d = 6.3246 (3.98 dB) e = {2, -2, 0, 2, 0, -2, 2, -2, 2}
d = 6.3246 (3.98 dB) e = {2, -2, 0, 2, 0, -2, 2, 0, 0}
d = 6.3246 (3.98 dB) e = {2, -2, 2, -2, 0, -2, 2, -2, 0}
d = 6.3246 (3.98 dB) e = {2, -2, 2, -2, 0, -2, 2, -2, 2}
d = 6.3246 (3.98 dB) e = {2, -2, 2, -2, 0, -2, 2, 0, 0}
d = 6.3246 (3.98 dB) e = {2, -2, 2, -2, 0, 0, -2, 0, 0}
d = 6.3246 (3.98 dB) e = {2, -2, 2, -2, 0, 0, 0, -2, 0}
d = 6.3246 (3.98 dB) e = {2, -2, 2, -2, 0, 0, 0, 0, -2}
d = 6.3246 (3.98 dB) e = {2, -2, 2, -2, 0, 0, 0, 0, 2}
d = 6.3246 (3.98 dB) e = {2, -2, 2, -2, 0, 0, 0, 2, 0}
d = 6.3246 (3.98 dB) e = {2, -2, 2, -2, 0, 0, 2, 0, 0}
d = 6.3246 (3.98 dB) e = {2, -2, 2, -2, 0, 2, 0, -2, 2}
d = 6.3246 (3.98 dB) e = {2, -2, 2, -2, 0, 2, 0, -2, 2}
d = 6.3246 (3.98 dB) e = {2, -2, 2, -2, 2, -2, 0, -2, 2}
d = 6.3246 (3.98 dB) e = {2, -2, 2, -2, 2, -2, 0, 0, -2}
d = 6.3246 (3.98 dB) e = {2, -2, 2, -2, 2, 2, -2, 0, 0, 2}
d = 6.3246 (3.98 dB) e = {2, -2, 2, -2, 2, 0, 0, -2, 0}
d = 6.3246 (3.98 dB) e = {2, -2, 2, -2, 2, 0, 0, 0, -2}
d = 6.3246 (3.98 dB) e = {2, -2, 2, -2, 2, 0, 0, 0, 2}
d = 6.3246 (3.98 dB) e = {2, -2, 2, -2, 2, 0, 0, 2, 0}
d = 6.3246 (3.98 dB) e = {2, -2, 2, -2, 2, 0, 2, -2, 0}
d = 6.3246 (3.98 dB) e = {2, -2, 2, -2, 2, 0, 2, -2, 2}
d = 6.3246 (3.98 dB) e = {2, -2, 2, 0, -2, 0, 2, -2, 0}
d = 6.3246 (3.98 dB) e = {2, -2, 2, 0, -2, 0, -2, 2, 2}
d = 6.3246 (3.98 dB) e = {2, -2, 2, 0, -2, 2, -2, 0, 2}
d = 6.3246 (3.98 dB) e = {2, -2, 2, 0, -2, 2, 0, -2, 0}
d = 6.3246 (3.98 dB) e = {2, -2, 2, 0, 0, -2, 0, 0, 0}
d = 6.3246 (3.98 dB) e = {2, -2, 2, 0, 0, 0, 0, -2, 0, 0}
d = 6.3246 (3.98 dB) e = {2, -2, 2, 0, 0, 0, 0, 0, -2, 0}
d = 6.3246 (3.98 dB) e = {2, -2, 2, 0, 0, 0, 0, 0, 0, -2}
d = 6.3246 (3.98 dB) e = {2, -2, 2, 0, 0, 0, 0, 0, 0, 2}
d = 6.3246 (3.98 dB) e = {2, -2, 2, 0, 0, 0, 0, 0, 2, 0}
d = 6.3246 (3.98 dB) e = {2, -2, 2, 0, 0, 0, 0, 2, 0, 0}
d = 6.3246 (3.98 dB) e = {2, -2, 2, 0, 0, 2, -2, 0, 0, 0}
d = 6.3246 (3.98 dB) e = {2, -2, 2, 0, 2, -2, 0, 0, 0}
d = 6.3246 (3.98 dB) e = {2, -2, 2, 0, 2, -2, 2, -2, 0}
d = 6.3246 (3.98 dB) e = {2, -2, 2, 0, 2, -2, 2, -2, 2}
d = 6.3246 (3.98 dB) e = {2, -2, 2, 0, 2, -2, 2, 0, 0}
d = 6.3246 (3.98 dB) e = {2, 0, -2, 0, 0, 0, 0, 0, 0}
d = 6.3246 (3.98 dB) e = {2, 0, -2, 2, -2, 0, 2, -2, 0}
d = 6.3246 (3.98 dB) e = {2, 0, -2, 2, -2, 0, 2, -2, 2}
d = 6.3246 (3.98 dB) e = {2, 0, -2, 2, -2, 2, 0, -2, 2}
d = 6.3246 (3.98 dB) e = {2, 0, -2, 2, 0, -2, 2, -2, 0}
d = 6.3246 (3.98 dB) e = {2, 0, -2, 2, 0, -2, 2, -2, 2}
d = 6.3246 (3.98 dB) e = {2, 0, -2, 2, 0, -2, 2, 0, 0}
d = 6.3246 (3.98 dB) e = {2, 0, 0, -2, 2, -2, 0, 0, 0}
d = 6.3246 (3.98 dB) e = {2, 0, 0, -2, 2, -2, 2, -2, 0}
d = 6.3246 (3.98 dB) e = {2, 0, 0, -2, 2, -2, 2, -2, 2}
d = 6.3246 (3.98 dB) e = {2, 0, 0, -2, 2, -2, 2, 2, 0}
d = 6.3246 (3.98 dB) e = {2, 0, 0, -2, 2, 0, 0, 0, 0}
d = 6.3246 (3.98 dB) e = {2, 0, 0, 0, -2, 2, -2, 0, 0}
d = 6.3246 (3.98 dB) e = {2, 0, 0, 0, -2, 2, -2, 2, -2}
d = 6.3246 (3.98 dB) e = {2, 0, 0, 0, -2, 2, -2, 2, 0}
d = 6.3246 (3.98 dB) e = {2, 0, 0, 0, -2, 2, 0, 0, 0}
d = 6.3246 (3.98 dB) e = {2, 0, 0, 0, 0, -2, 2, -2, 0}
d = 6.3246 (3.98 dB) e = {2, 0, 0, 0, 0, -2, 2, -2, 2}
d = 6.3246 (3.98 dB) e = {2, 0, 0, 0, 0, -2, 2, 0, 0}
d = 6.3246 (3.98 dB) e = {2, 0, 0, 0, 0, 0, -2, 2, -2}
d = 6.3246 (3.98 dB) e = {2, 0, 0, 0, 0, 0, 0, -2, 2}
d = 6.3246 (3.98 dB) e = {2, 0, 0, 0, 0, 0, 0, 2, -2}
d = 6.3246 (3.98 dB) e = {2, 0, 0, 0, 0, 0, 2, -2, 0}
d = 6.3246 (3.98 dB) e = {2, 0, 0, 0, 0, 2, -2, 2}
d = 6.3246 (3.98 dB) e = {2, 0, 0, 0, 0, 2, -2, 0, 0}
d = 6.3246 (3.98 dB) e = {2, 0, 0, 0, 0, 2, -2, 2, -2}
d = 6.3246 (3.98 dB) e = {2, 0, 0, 0, 0, 2, -2, 2, 0}
d = 6.3246 (3.98 dB) e = {2, 0, 0; 0, 2, -2, 0, 0, 0}

TABLE 1-continued d = 6.3246 (3.98 dB) e = {2, 0, 0, 0, 2, -2, 2, -2, 0}
d = 6.3246 (3.98 dB) e = {2, 0, 0, 0, 2, -2, 2, -2, 2}
d = 6.3246 (3.98 dB) e = {2, 0, 0, 2, -2, 2, 0, 0}
d = 6.3246 (3.98 dB) e = {2, 0, 0, 2, -2, 0, 0, 0, 0}
d = 6.3246 (3.98 dB) e = {2, 0, 0, 2, -2, 2, -2, 0, 0}
d = 6.3246 (3.98 dB) e = {2, 0, 0, 2, -2, 2, -2, 2, -2}
d = 6.3246 (3.98 dB) e = {2, 0, 0, 2, -2, 2, -2, 2, 0}
d = 6.3246 (3.98 dB) e = {2, 0, 0, 2, -2, 2, 0, 0, 0}

Because channel 160 is linear, the distance for events in which the sign is reversed is identical. The distances "d" were computed using the equation, $$d = \sqrt{\sum_{k=0}^{\infty} \left( \sum_{i=0}^{N-1} f_i e_{k-i} \right)^2} \qquad \text{Eq. 9}$$

where N is the length of the channel response f. Also shown in Table 1 are the distances in decibels (dB) from the minimum distance event. As discussed below, the underlined error event in Table 1 corresponds to the minimum distance achieved by the coding scheme adopted in one embodiment of the present invention.

Another commonly used figure-of-merit is the matched filter distance. This is the distance seen by the detector if only a single channel symbol is transmitted so that the detector is not affected by the channel's inter-symbol interference (ISI) character. A matched filter distance can be computed using the distance formula above by setting the error event equal to $e_k = \{+2, 0, 0, 0, \ldots\}$. For the PR2 channel, the matched filter distance is d=4.899. Thus, the ISI structure of the channel degrades its minimum distance by 1.76 dB.

4. Modulation Code Constraints

The modulation code imposed by encoder 150 (shown in FIG. 2) provides an increase in the minimum distance by applying constraints that prevent the transmission of two sequences whose difference corresponds to a low-distance error event. To eliminate error events with distances less than the matched filter bound, a time-varying maximum transition run (MTR) code can be used.

A traditional MTR code applies constraints MTR(j;k) to the code bit sequence $Y_n$ to eliminate code bit sequences with more than j consecutive transitions and more than k consecutive non-transitions. A time-varying MTR code has constraints MTR($j_1/j_2$;k), which prevent more than $j_1$ consecutive transitions starting from an odd-bit position in the sequence and $j_2$ consecutive transitions starting from an even-bit position in the sequence. The assignment of constraints to even or odd bit positions in encoder 150 can be reversed, provided any constraint in detector 172 and decoder 176 is modified to reflect this change.

Error events with the form +{+2,-2} can be eliminated by using a code with constraints MTR(1/2;k). Practical codes with this constraint can be obtained with a code rate of 3/4; with k=6. The capacity for these MTR constraints is 0.7925. Unfortunately, the increase in bandwidth required for the low code rate would increase the noise power by 1.25 dB. In addition, the energy in the channel symbol would decrease as the density increases, so the net effect would be a performance loss.

In one embodiment of the present invention, the minimum Euclidean distance is increased further by eliminating the single-bit error event. If encoder 150 and the Viterbi trellis in detector 172 are modified to incorporate a parity constraint in addition to the MTR constraints, then error events with an odd number of errors (non-zero error bits within the event) occurring within a single code word can be prevented. This will eliminate the single-bit error event, as well as three-bit events, five-bit events, and so on.

After combining the parity constraint with the MTR(1/2;k) constraint, the minimum distance error event becomes $e_k=+\{2, 0, -2\}$, which is underlined in Table 1. This corresponds to a minimum distance of d=6.32, or a 3.98 dB gain. However, system 148 will not see a full performance gain of 4 dB. Instead, this distance will be reduced by a loss in SNR implied by the use of a lower rate code. The capacity of the combined MTR and parity constraints is therefore less than the 0.7925 capacity of the MTR constraints alone.

5. Encoder/Decoder Design Example

Encoder 150 and decoder 176 are designed to implement the code constraints discussed above. These constraints can be implemented in a state machine, combinational logic, or a software or hardware look-up table, for example. Other configurations can also be used.

The MTR constraint is more restrictive than the parity constraint, so the MTR constraint is a reasonable starting point for discussion. In one embodiment, the encoder and decoder are adapted to implement a rate 3/4 MTR(1/2;6) code defined by the mapping shown in Table 2.

TABLE 2

| $X_m \leftrightarrow Y_n$ | $X_m \leftrightarrow Y_n$ |
|---|---|
| 000 ↔ 1000 | 100 ↔ 0100 |
| 001 ↔ 0001 | 101 ↔ 0101 |
| 010 ↔ 0010 | 110 ↔ 0110 |
| 011 ↔ 1001 | 111 ↔ 1010 |

The selected code words in Table 2 satisfy the selected MTR constraints, even when the code words are concatenated with one another. A "1" in the code word represents a transition in the write current polarity at the output of modulator 159 in FIG. 2. The number of consecutive transitions is limited to one when the sequence of transitions begins in odd bit positions within each code word, and the number of consecutive transitions is limited to two when the sequence of transitions begins in even bit positions within each code word. There is a maximum possible run of six non-transitions (i.e. "0's"), when the code words are concatenated with one another. In alternative embodiments, the k constraint can have other values, including infinity.

The parity constraint is enforced via the concatenation of a two-bit sequence $(Z_n, Z_{n+1})$ to each code word $Y_n$ (or each string of code words). First, the parity of the preceding bits in the code word is determined. If the data word is represented by $X_m=[x_0, x_1, \ldots, x_{m-1}]$ and the code word by $Y_n=[y_0, y_1, \ldots, y_{n-1}]$, then for a code word starting with time index k, the binary {0,1} NRZ symbols that would be transmitted at the output of precoder 148 are determined by the modulo-2 addition of the previous symbol and the present code bit according to the following equation, $$a_k = a_{k-1} \oplus y_k \qquad \text{Eq. 10}$$

The parity for the number of NRZ 1's is determined by setting the initial condition $Q_{k-1}=0$, where "$Q_{k-1}$" is the parity of the previous code bits, and calculating, $$Q_i = Q_{i-1} \oplus a_k, \; i=k \ldots k+n-1. \qquad \text{Eq. 11}$$

For even parity, Q=0, and for odd parity, Q=1. In one embodiment, the two bits $Z_n$, $Z_{n+1}$ are selected to provide even parity as $$[z_n \; z_{n+1}] = \begin{cases} [10], & \text{if } Q = 0 \\ [01], & \text{if } Q = 1. \end{cases} \qquad \text{Eq. 12}$$

This results in the desired parity at the output of precoder 156. The MTR+parity code word at the output of encoder 150 in FIG. 2 is then $$Z_{n+2} = [Y_n z_n z_{n+1}]. \qquad \text{Eq. 13}$$

Thus, $X_m \Leftrightarrow Z_{n+2}$ forms a rate m/(n+2) parity code. The two-bit sequences that determine the final parity where chosen because they do not violate the MTR(1/2; k) constraints. In fact, when concatenated with the rate 3/4 MTR (1/2; 6) code, all the constraints are preserved and a rate 3/6 code results. The fact that the constraints from the rate 3/4 code words are preserved implies that multiple words from the MTR code can be concatenated to form a longer word prior to concatenating the parity constraint bits. If p repetitions of the 3/4 encoder are used, then the resulting encoder has rate 3p/(4p+2). For p=1, the rate is 3/6=0.5, but for p=16, the rate is 48/66=0.7273. As an example, the rate 3/6 code mapping is shown in Table 3.

TABLE 3

| $X_m \leftrightarrow Y_n, Z_n, Z_{n+1}$ | $X_m \leftrightarrow Y_n, Z_n, Z_{n+1}$ |
|---|---|
| 000 ↔ 100010 | 100 ↔ 010001 |
| 001 ↔ 000101 | 101 ↔ 010110 |
| 010 ↔ 001010 | 110 ↔ 011001 |
| 011 ↔ 100101 | 111 ↔ 101010 |

If it is desired to concatenate "p" of the rate 3/4 codes, then encoder 150 creates $$[X_3^{(1)} X_3^{(2)} \ldots X_3^{(p)}] = [Y_4^{(1)} Y_4^{(2)} \ldots Y_4^{(p)} z_n z_{n+1}] \qquad \text{Eq. 14}$$

where each 3-bit $X_3$ to 4-bit $Y_4$ mapping is performed using the rate 3/4 MTR(1/2;6) encoder/decoder. This formulation provides a block encoder-decoder form that is straightforward to implement.

FIG. 5 is a block diagram, which logically illustrates a block encoder in which a plurality of rate 3/4 encoding functions $250_{0-250i}$, where i=p−1, are concatenated with one another and with a two-bit parity sequence as described above, according to one embodiment of the present invention. For m=3, encoder 150 receives user data bits $X_3=[x_0, x_1, x_2, \ldots x_{3i}, x_{3i+1}, x_{3i+2}]$ on 152, which are passed to respective encoder functions $250_0-250_i$. Each encoder function $250_0-250_i$ encodes the respective 3-bit user data bit sequence into a corresponding 4-bit code word bit sequence on output 153 according to Table 2 above. For n=4, the respective 4-bit code word bit sequences are labeled $Y_4=[y_0, y_1, y_2, y_3, \ldots, y_{4i}, y_{4i+1}, y_{4i+2}, y_{4i+3}]$. In addition, each encoder stage calculates the parity Q for each bit sequence according to Equation 11 above. For example, $Q_3$ is calculated based on the initial condition $a_{k-1}=0$ and $Q_{k-1}=0$. The NRZI bit $a_3$ is calculated and provided with $Q_3$ as an initial condition for the next encoder function stage $250_1$, from which $Q_7$ is calcultated. This process repeats for each encoder stage until the final parity $Q_{4i+3}$ is calculated. Based on the value of $Q_{4i+3}$ and the equations given above, parity generator 252 then generates the two parity constraint bits $Z_{4i+4}$ and $Z_{4i+5}$, which are appended to the end of the concatenated code words on output 153 such that the resulting precoded bit sequence $a_0 \ldots a_{4i+5}$ at the output of precoder 156 has even or, alternatively, odd parity.

FIG. 6 is a diagram, which logically illustrates the function performed by decoder 176. Decoder 176 includes a plurality of decoder function stages $254_0-254_i$, which use the inverse of the rate 3/4 MTR(1/2;6) coding rules used by encoder 150 and convert successive code words $Y_4=[y_0, y_1, y_2, y_3, \ldots, y_{4i}, y_{4i+1}, y_{4i+2}, y_{4i+3}]$ received on input 175 into respective data words $X_3=[x_0, x_1, x_2, \ldots x_{3i}, x_{3i+1}, x_{3i+2}]$ on output 177. Decoder 176 ignores the two parity constraint bits $Z_{4i+4}$ and $Z_{4i+5}$ because parity will be enforced by the detector.

FIG. 7 is a diagram illustrating an example of the calculation and concatenation of parity bits in a sample code word stream 260. Code word stream 260 is formed of two concatenated code words 261 and 262, which have the values "1001" and "1010", respectively. Two parity bits 263 having the value "01" are appended to the end of code word 261, prior to the beginning of code word 262. Code words 261 and 262 each have a code word length of four bits. The first bit in time is to the far left of stream 260 and later bits in time extend to the right. Line 266 assigns an integer to each bit in code words 261 and 262 based on its overall location within the respective code word. Under this numbering system, the first bit in each code word is the most significant bit and is numbered as bit three for code words 261 and 262. The last bit in each code word is the least significant bit and is numbered as bit zero. Line 267 assigns an integer to each bit in code words 261 and 262 and parity bits 263 based on its temporal location within the overall code word stream 160.

Even/odd line 268 lies above line 267 and provides an "E" designation for each even bit in code word stream 260 and an "O" designation for each odd bit in code stream 260. The "E" and "O" designation is vertically aligned with its respective bit in code word stream 260. MTR line 269 designates the MTR constraint for each bit location in code word stream 260. Each odd bit location in code word stream 260 has an MTR constraint of one, and each even bit location in code word stream 260 has an MTR constraint of two. Since the number of parity bits appended to code word 261 is even, corresponding bit locations (as designated by line 266) in successive code words 261 and 262 have the same MTR constraint. This helps to ensure that all MTR constraints are satisfied in the overall code stream 260 at the boundaries between the individual code words in the stream. For example, there are only two transitions ("1's") in code word stream 260, beginning at the even bit position 6, as represented by the "1's" in bit positions 6 and 7. This satisfies the MTR constraint, which limits the maximum number of transitions, that begin in even bit positions, to two.

Line 270 represents the output of pre-coder 156, which is determined by Equation 10 above. Each bit in line 270 is the exclusive-OR of the previous precoded bit in line 270 and the present code word bit in line 260, assuming an initial condition of $a_{k-1}=0$ (i.e. the bit prior to the first bit in line 270) The output of pre-coder 156 therefore has an odd number of "1's" in bit positions 1–4, determined by line 267. The additional pre-coded parity bits in bit positions 5 and 6 cause the pre-coder output in line 270 to have even parity in bits 1–6, since an additional "1" is added to this set of bits in the stream.

Line 271 represents the calculated value of "Q" at each bit position. As described above, $Q_i = Q_{i-1} \oplus a_k$, for i=k . . . k+n−1, and $Q_{k-1}$ is assumed to be zero. Since $Q_3$ (the value of Q in bit position 4 in line 271 FIG. 7) is "1", the parity bits $Z_n$ and $Z_{+1}$ added in positions 5 and 6 of code word stream 260 are "01" according to Equation 12 above.

6. Viterbi Detector

In one embodiment, viterbi detector 172 is adapted to implement a Viterbi algorith for detecting data constrained by the combined MTR and parity constrained code for a PR2 channel. The trellis can be used for any length three channel response and can be generalized for longer responses (such as EPR2, etc.). The MTR constraints are time varying and depend on the sample index, k, so the trellis is also time varying.

FIG. 8 shows an example of trellis state machine diagram section 300 for an MTR(1/2;k) coded PR2 channel. Note that the inputs $\{a_{k-2}, a_{k-1}\}$ to the trellis are shown in bipolar $\{-1,+1\}$ form. In later figures, a binary representation $\{0,1\}$ are used with implied equivalency. Trellis 300 has a plurality of discrete time intervals represented by a vertically oriented group of states, which determines a noiseless output sequence for any user input sequence from the channel. Each state is generally implemented as an add-compare select (ACS) unit, as is generally known. The ACS unit adds the metric of each branch to the total metric in its corresponding path. The metrics from the two incoming paths to each state are then compared and the path with the best metric is selected. Trellis 300 is modified to enforce the chosen MTR constraints by disallowing paths 302 and 304 (shown by dashed lines), which correspond to bit sequences that have been removed by encoder 150 to avoid their respective error events. Assuming section 306 represents an even bit position, and section 308 represents an odd bit position, paths 302 and 304 are removed in section 308 since two consecutive transitions that start at odd bit positions are not allowed, for example.

FIG. 9 shows a trellis section 310 of length three, which is similar to trellis section 300, but has been modified to include the parity "Q" of the path for each state. The parity of the path for each state is tracked until the end of the code word. At that point, the states corresponding to odd parity (Q=1, in the lower half of trellis section 310) are pruned from the trellis. FIG. 10 shows a trellis section 320 that is extended to include a six-bit code word (a rate 3/6 code from the previous example) and in which the states corresponding to odd parity have been removed. For practical reasons, a VLSI design might include all states that might be needed at any point in time. However, some of the states have no input, so their metrics are made large to prevent them from influencing the trellis at a later point. FIG. 11 shows trellis section 320 with all unused states removed.

7. Simulation Results

The coding constraints discussed above were implemented in a rate 48/66 code. This was simulated against a standard rate 16/17 RLL(0,6/6) code, as discussed in P. Tsang U.S. Pat. No. 5,537,112, issued Jul. 16, 1996 and entitled "Method and Apparatus for Implementing Run Length Limited Codes in Partial Response Channels," for a Gaussian channel model. The results at a user bit density (Du=code rate×$D_S$) of Du=0.7 are plotted in FIG. 12. Axis 350 represents the detector error rate, and axis 352 represents the SNR in dB. The detector bit error rate for the 16/17 rate code is shown by line 354, and the detector bit error rate for the 48/66 rate code is shown by line 356. At a user bit density of 0.7, the proposed 48/66 rate coding scheme provides a gain of 1 dB as compared with the rate 16/17 code. As the user bit density changes, the extent to which the PR2 polynomial and its error mechanisms are a good model for the channel response changes.

To examine this trade-off, the SNR required to obtain a fixed error rate of $10^{-5}$ was measured as a function of density. These results are plotted in FIG. 13. Axis 400 represents SNR (dB) at a bit error rate of 1×10$^{-5}$, axis 402 represents the user bit density Du, and axis 404 represents the coding gain between the two coding schemes. Line 406 shows the SNR for the 16/17 rate code, and line 408 shows the SNR for the 48/66 rate code. Line 410 shows the coding gain between the two coding schemes. The 48/66 rate code provides a significant gain at low densities. However, at a density around 0.85, the distance gain is offset by the code rate loss so the net gain is zero. At higher densities, the low code rate causes the proposed scheme to perform worse.

In an alternative embodiment, encoder 150 appends only one parity bit to the end of each code word (or each string of code words) to make the output of precoder 156 have either even or odd parity. However, a single parity bit makes the selection of valid code words more complex for a given MTR constraint since the parity bit can make it difficult to satisfy the MTR constraints at the boundaries between code words. For example, appending a single parity bit of "1" to the end of a "0001" code word from Table 2, which is then followed by a "1000" code words from Table 2, would result in the bit sequence "000111000". This sequence would fail an MTR(1/2;k) constraint since there are three successive transitions (i.e. "1's") in the sequence. Also, using a single parity bit makes it more difficult to maintain different MTR constraints for different temporal locations, such as even and odd locations, within each code word since an odd number of bits are added between code words. However, an odd number of parity bits can be used if desired.

9. Conclusion

The above-simulation results show that an MTR(1/2;k) plus parity constraint can be effective when used with low pass filter channels (having a Gaussian impulse response). At low user densities, the code provides up to 2 dB of margin, but for densities greater than 0.8, the gain is zero or negative. The coding constraints are enforced by modifications to the encoder and to the Viterbi algorithm.

In summary, one aspect of the present invention relates to a data storage channel encoder 150, which includes a data word input 152, a code word output 153. The encoder 150 is adapted to encode successive data words $X_m$ received on the data word input 152 into successive code words $Y_n$ on the code word output 153 according to a selected code having a combined MTR and parity constraints. The MTR constraint constrains the successive code words $Y_n$ such that, when the successive code words $Y_n$ are concatenated to form an encoded bit stream 260 on output 154, the encoded bit stream 260 on output 154 has a maximum of one consecutive transition beginning at either odd or even indexed bit positions 268 in the encoded bit stream 260 and a maximum of two consecutive transitions beginning at the other of the odd or even indexed bit positions 268.

In one embodiment, the selected code generates at least one parity bit $z_n$ on the code word output for each set of p successive code words $Y_n$, wherein p is a positive integer variable that is greater than zero. For example, two parity bits $z_n$ and $z_{n+1}$ can be used, which can include a binary "10" or a binary "01", depending upon the parity Q of the set of successive code words. In one example, the encoder 150 is adapted to encode successive 3-bit data words $X_m$ received on the data word input 152 into successive 4-bit code words $Y_m$ on the code word output 153 according to the selected code.

Another aspect of the present invention relates to a method of encoding successive data words $X_m$ into successive code words $Y_n$ for transmission through a channel 160. The method includes mapping each successive data word $X_m$ into a corresponding one of the code words $Y_n$ according to a selected code. The successive code words $Y_n$ are concatenated to form an encoded bit stream on output 154 having a plurality of even and odd indexed bit positions 268. A maximum transition run constraint MTR(1/2) is imposed on the selected code such that the encoded bit stream 260 on output 154 has a maximum possible run of one consecutive transition beginning in either one of the even or odd indexed bit positions 268 in the encoded bit stream 260 and has a maximum possible run of two consecutive transitions beginning in the other of the even or odd indexed bit positions 268 in the encoded bit stream 260. A parity constraint $z_n$, $Z_{n+1}$ is also imposed on the selected code.

Another aspect of the present invention relates to a data storage read channel 148 for use in detecting successive code words in a storage channel output 173, the successive code words being encoded according to a code. The read channel 148 includes a likelihood sequence detector 172, which is adapted to detect the successive code words. The detector 172 has a detection sequence 300, 310, 320 that effectively disallows detection of bit sequences in the storage channel output 173 having greater than one consecutive transition beginning at either odd or even indexed bit positions 268 in the bit sequence, bit sequences in the channel output 173 having greater than two consecutive transitions beginning at the other of the odd or even indexed bit positions 268, and bit sequences in the channel output 173 having a disallowed parity.

Yet another aspect of the present invention relates to a disc drive storage channel 148, which includes a transducer and an encoder 150, 155, 156, 158. The transducer is capable of communicating with a data storage disc. The encoder 150, 155, 156, 158 is coupled to the transducer for encoding successive data words $X_n$ into successive code words $Y_m$ according to a selected code to form an encoded bit stream 154, 260, pre-coding the encoded bit stream 154, 260 and applying the pre-coded bit stream 157 to the transducer as a channel input.

In one embodiment, the encoder constrains the successive code words $Y_n$ such that encoded bit stream 154 has a maximum of one consecutive transition beginning at either odd or even indexed bit positions 268 in the encoded bit stream and a maximum of two consecutive transitions beginning at the other of the odd or even indexed bit positions 268 and enforces a selected parity constraint on the channel input 157.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of structure and arrangement of parts within the principles of the present invention to the full extent indicated by the broad general meaning of the terms in which the appended claims are expressed. For example, the particular codes that are used can be modified, and these codes can be enforced with a variety of different hardware and/or software configurations. The sequence detector can include any of a variety of detector types, which has been modified to enforce the selected code constraints.

What is claimed is:

1. A data storage channel encoder comprising:
   a data word input;
   a code word output; and
   an encoder, which is coupled between the data word input and the code word output and encodes successive data words received on the data word input into successive code words on the code word output according to a selected code having combined maximum transition run and parity constraints, wherein the maximum transition run constraint constrains the successive code words such that, when the successive code words are concatenated to form an encoded bit stream, the encoded bit stream has a maximum of one consecutive transition beginning at either odd or even indexed bit positions in the encoded bit stream and a maximum of two consecutive transitions beginning at the other of the odd or even indexed bit positions.

2. The data storage channel encoder of claim 1 wherein the parity constraint generates at least one parity-enforcing bit on the code word output for each set of p successive code words, wherein p is a positive integer variable that is greater than zero.

3. The data storage channel encoder of claim 2 wherein the parity constraint generates and appends a single parity-enforcing bit to each set of p code words to enforce the parity constraint.

4. The data storage channel encoder of claim 2 wherein the parity constraint appends two parity-enforcing bits to each set of p code words to enforce the parity constraint.

5. The data storage channel encoder of claim 4 wherein the two parity constraint bits comprise either a binary "10" or a binary "01", depending upon the parity of the set of p code words.

6. The data storage channel encoder of claim 1 wherein the encoder encodes successive 3-bit data words received on the data word input into successive 4-bit code words on the code word output according to the selected code.

7. A method of encoding successive data words into successive code words for transmission through a channel, the method comprising steps of:

(a) mapping each successive data word into a corresponding one of the code words according to a selected code; and (b) concatenating the successive code words to form an encoded bit stream having a plurality of even and odd indexed bit positions, wherein the mapping step (a) enforces a parity constraint on the selected code and a maximum transition run constraint on the selected code such that the encoded bit stream has a maximum possible run of one consecutive transition beginning in either one of the even or odd indexed bit positions in the encoded bit stream and has a maximum possible run of two consecutive transitions beginning in the other of the even or odd indexed bit positions in the encoded bit stream.

8. The method of claim 7 and further comprising:

(c) pre-coding the encoded bit stream from a non-return-to-zero-inversion format into a non-return-to-zero format, wherein the parity constraint enforced by the mapping step (a) results in each set of p consecutive code words in the selected code format having either even parity or odd parity, where p is a positive integer variable greater than zero.

9. The method of claim 7 wherein the mapping (a) comprises concatenating at least one parity-enforcing bit to each set of p consecutive code words, where p is a positive integer greater than zero, such that each set of p consecutive code words and the at least one parity-enforcing bit together satisfy the maximum transition run constraint within the encoded bit stream.

10. The method of claim 9 wherein the mapping step (a) comprises concatenating two parity-enforcing bits to each set of p consecutive code words.

11. The method of claim 10 wherein the mapping step (a) comprises concatenating either a binary "10" or a binary "01" to each set of p consecutive code words, depending upon the parity of that set of p consecutive code words.

12. The method of claim 9 wherein the mapping step (a) comprises concatenating a single parity-enforcing bit to each set of p consecutive code words.

13. The method of claim 7 wherein the mapping step (a) comprises mapping successive 3-bit data words into successive 4-bit code words according to the selected code.

14. A data storage read channel for use in detecting successive code words in a storage channel output, the successive code words being encoded according to a code, the read channel comprising:

a likelihood sequence detector, which detects the successive code words, wherein the detector has a detection sequence that effectively disallows detection of bit sequences in the storage channel output having greater than one consecutive transition beginning at either odd or even indexed bit positions in the bit sequence, bit sequences in the channel output having greater than two consecutive transitions beginning at the other of the odd or even indexed bit positions, and bit sequences in the channel output having a disallowed parity.

15. The data storage read channel of claim 14 wherein the likelihood sequence detector implements a Viterbi algorithm, which is represented by a trellis diagram with a plurality of states connected by a plurality of branches, wherein selected ones of the plurality of branches that correspond to the bit sequences having greater than one consecutive transition beginning at either odd or even indexed bit positions and that correspond to the bit sequences having greater than two consecutive transitions beginning at the other of the odd or even indexed bit positions are effectively disallowed and wherein selected ones of the plurality of states that correspond the bit sequences having the selected disallowed parity in the channel output are effectively disallowed.

16. A disc drive storage channel comprising:

a transducer capable of communicating with a data storage disc; and encoding means coupled to the transducer for encoding successive data words into successive code words according to a selected code to form an encoded bit stream, pre-coding the encoded bit stream and applying the pre-coded bit stream to the transducer as a channel input, wherein the encoding means comprises means for constraining the successive code words such that encoded bit stream has a maximum of one consecutive transition beginning at either odd or even indexed bit positions in the encoded bit stream and a maximum of two consecutive transitions beginning at the other of the odd or even indexed bit positions; and means for enforcing a selected parity constraint on the channel input.

* * * * *

UNITED STATES PATENT AND TRADEMARK OFFICE
CERTIFICATE OF CORRECTION

PATENT NO. : 6,388,587 B1
DATED : May 14, 2002
INVENTOR(S) : Barrett J. Brickner et al.

It is certified that error appears in the above-identified patent and that said Letters Patent is hereby corrected as shown below:

Column 14,
Line 13, change "$X_m \leftrightarrows Z_{n+2}$" to

-- $X_m \leftrightarrow Z_{n+2}$ --.

Line 44, change "$250_{0-250i}$" to

-- $250_0 - 250_i$ --.

Column 15,
Line 63, change "$Q_i = Q_{i-1} \oplus a_k,$" to

-- $Q_i = Q_{i-1} \oplus a_k,$ --.

Column 13, Equation 10, change "$a_k = a_{k-1} \oplus y_k$" to

-- $a_k = a_{k-1} \oplus y_k$ --.

Equation 11, change "$Q_i = Q_{i-1} \oplus a_k, \ i = k...k+n-1.$" to

-- $Q_i = Q_{i-1} \oplus a_k, \ i = k...k+n-1.$ --.

UNITED STATES PATENT AND TRADEMARK OFFICE
CERTIFICATE OF CORRECTION

PATENT NO. : 6,388,587 B1
DATED : May 14, 2002
INVENTOR(S) : Barrett J. Brickner et al.

It is certified that error appears in the above-identified patent and that said Letters Patent is hereby corrected as shown below:

Column 14, Equation 14, change "$[X_3^{(1)} X_3^{(2)} ... X_3^{(p)}] = [Y_4^{(1)} Y_4^{(2)} ... Y_4^{(p)} z_n z_{n+1}]$"

to -- $[X_3^{(1)} X_3^{(2)} ... X_3^{(p)}] \leftrightarrow [Y_4^{(1)} Y_4^{(2)} ... Y_4^{(p)} z_n z_{n+1}]$ --.

Column 20,
Line 41, after "correspond" add -- to --.

Signed and Sealed this

Twentieth Day of May, 2003

JAMES E. ROGAN
*Director of the United States Patent and Trademark Office*